(12) United States Patent
Usui et al.

(10) Patent No.: US 6,924,159 B2
(45) Date of Patent: Aug. 2, 2005

(54) SEMICONDUCTOR SUBSTRATE MADE OF GROUP III NITRIDE, AND PROCESS FOR MANUFACTURE THEREOF

(75) Inventors: Akira Usui, Tokyo (JP); Masatomo Shibata, Ibaraki (JP); Yuichi Oshima, Ibaraki (JP)

(73) Assignees: NEC Corporation, Tokyo (JP); Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 10/105,404

(22) Filed: Mar. 26, 2002

(65) Prior Publication Data

US 2002/0197825 A1 Dec. 26, 2002

(30) Foreign Application Priority Data

Mar. 27, 2001 (JP) ........................................ 2001-090148
Oct. 1, 2001 (JP) ........................................ 2001-305055
Mar. 8, 2002 (JP) ........................................ 2002-064345

(51) Int. Cl.⁷ ............................................. H01L 21/00
(52) U.S. Cl. ............................ 438/22; 438/46; 438/47; 438/48; 438/85; 438/93
(58) Field of Search ...................... 438/22, 46, 47–48, 438/85, 93

(56) References Cited

U.S. PATENT DOCUMENTS 4,792,467 A * 12/1988 Melas et al. ............. 427/248.1
6,583,690 B2 * 6/2003 Lee et al. .................... 333/193

FOREIGN PATENT DOCUMENTS

| JP | 60-173829 | 9/1985 |
| JP | A 63-188983 | 8/1988 |
| JP | A 10-312971 | 11/1998 |
| JP | A 2000-12900 | 1/2000 |
| JP | A 2000-228539 | 8/2000 |

OTHER PUBLICATIONS

Masaru Kuramoto et al., "Room–Temperature Continuous–Wave Operation of InGaN Multi–Quantum–Well Laser Diodes Grown on an n–GaN Substrate with a Backside n–Contact," *Jpn. J. Appl. Phys.*, V. 38, 1999, pp. L184–L186.

Tsvetanka S. Zheleva et al., Pendeo–Epitaxy—A New Approach for Lateral Growth of Gallium Nitride Structures, *MRS Internet J. Nitride Semicond. Res.*, 4S1, G3.38, 1999, pp. 1–6.

Ok–Hyun Nam et al., "Lateral Epitaxy of Low Defect Density GaN Layers Via Organometallic Vapor Phase Epitaxy," *Appl. Phys. Lett.*, V. 71, 1997, pp. 1–3.

* cited by examiner

*Primary Examiner*—Hsien-Ming Lee
(74) *Attorney, Agent, or Firm*—Young & Thompson

(57) ABSTRACT

To provide a semiconductor substrate of a group III nitride with low defect density and little warp, this invention provides a process comprising such steps of:

forming a GaN layer 2 on a sapphire substrate 1 of the C face ((0001) face); forming a titanium film 3 thereon; heat-treating the substrate in an atmosphere containing hydrogen gas or a gas of a compound containing hydrogen to form voids in the GaN layer 2; and thereafter forming a GaN layer 4 on the GaN layer 2'.

37 Claims, 14 Drawing Sheets

(a)

(b)

(c)

(d)

(a)

(b)

(c)

(d)

(e)

(f)

(a)

(b)

(c)

SEMICONDUCTOR SUBSTRATE MADE OF GROUP III NITRIDE, AND PROCESS FOR MANUFACTURE THEREOF

FIELD OF THE INVENTION

The present invention relates to a crystalline substrate of a nitride-based compound semiconductor, and a process for manufacture thereof.

BACKGROUND TO THE INVENTION

GaN-based compound semiconductors, such as gallium nitride (GaN), indium gallium nitride (InGaN) and gallium aluminum nitride (GaAlN), are spotlighted as materials for a blue-light-emitting diode (LED) and a laser diode (LD). Furthermore, development for the application of GaN-based compound semiconductors for electronic devices has been started utilizing their features of high heat resistance and environment friendliness.

The bulk crystal growth of GaN-based compound semiconductors is difficult; therefore, a GaN substrate that could be adapted to practical use has not yet been obtained. A substrate for GaN growth widely put to practical use today is sapphire, and a method for the epitaxial growth of GaN on a single-crystal sapphire substrate by metal-organic vapor phase epitaxy (MOVPE) technique and the like is commonly used.

Since the lattice constant of a sapphire substrate differs from that of GaN, a continuous GaN single crystalline film cannot be grown directly on the sapphire substrate. Therefore, a process wherein the strain of the lattice is relieved by a buffer layer of AlN or GaN grown on the sapphire substrate at a low temperature, and then GaN is grown thereon has been proposed (Japanese Patent Laid-Open No. 63-188983). The use of a nitride layer grown at a low temperature as a buffer layer has enabled the single-crystalline epitaxial growth of GaN. However, even this method cannot compensate the lattice-mismatch between the substrate and the crystal, and the GaN film has numerous defects. These numerous defects are considered to interfere with the manufacture of a GaN-base LD. In recent years, as a method for reducing the density of the defects caused by the difference in lattice constants between sapphire and GaN, crystal growth techniques, such as ELO (Appl. Phys. Lett. 71 (18) 2638 (1997)), FIELO (Jpn. J. Appl. Phys. 38, L184 (1999)), and pendeo epitaxy (MRS Internet J. Nitride Semicond. Res. 4S1, G3.38 (1999)) have been reported, and GaN epitaxial wafers having a drastically high crystalline quality have been obtained.

BRIEF SUMMARY OF THE INVENTION

Object of the Invention

Although single crystalline GaN layers with low defect density have been able to grow using methods such as ELO and FIELO, the above-described epitaxial wafer has still had a problem of the warp of the substrate caused by difference in lattice constants or coefficients of thermal expansion between sapphire and GaN. If a substrate is warped, not only the substrate is broken easily during handling, but when a mask pattern is printed on the substrate in the photolithography step in the device process and the like, the image cannot be projected in focus uniformly on the surface of the substrate, and thus the yield of device manufacturing lowers. For these reasons, the development of a warp-free GaN epitaxial substrate having low defect density is strongly demanded. Furthermore, although the development of a warp-free GaN bulk substrate having low defect density is mostly desired, the fabrication of a large bulk GaN crystal is very difficult, and the crystal that can be adapted to practical use has not yet been obtained. Recently, there has been proposed a method for producing a freestanding GaN substrate by the hetero-epitaxial growth of a thick GaN film on a substrate using HVPE (hydride vapor phase epitaxy) method or the like, then removing the substrate. In this method, however, the technique for separating the GaN grown from the sapphire substrate by etching has not yet been developed. Although a method for mechanically removing the sapphire substrate by polishing has been tried, it has not yet put to practical use because the warp of the substrate is enhanced during the step of polishing and the substrate may happen to break. A method wherein a thick GaN layer is grown by HVPE method, then radiating laser pulses to peel only the GaN layer off was reported in Jpn. J. Appl. Phys. Vol. 38 (1999) Pt. 2, No. 3A. However, this method also has a problem that the crack in substrate is easily induced. As a method using a substrate that can be removed easily, Japanese Patent Laid-Open No. 2000-012900 discloses a method for growing a thick GaN layer on a GaAs substrate by HVPE method, then removing the GaAs substrate. Although a GaN substrate of large dimensions can be produced at a relatively high yield by using this method, it has a problem that the GaAs substrate decomposes during the growth of GaN crystals, and As mixes in the GaN as an impurity. In order to reduce the defect density of epitaxially grown GaN, although selective growth using a patterned mask as in the above-described FIELO is effective, and such techniques were disclosed in Japanese Patent Laid-Open No. 10-312971 (1998) and so on, this approach has not yet been applied to the manufacture of a freestanding GaN substrate, because there have not been a technique for separating the substrate easily.

SUMMARY OF THE INVENTION

In light of the above problems, an object of the present invention is to provide a semiconductor substrate of a group III nitride having a low defect density and little warp.

According to the present invention, there is provided a process for manufacturing a semiconductor substrate made of a group III nitride, comprising the steps of:

heat-treating a basal substrate having a first semiconductor layer of a group III nitride formed on a base material or a basal substrate comprising a first semiconductor layer of a group III nitride to form voids in the first semiconductor layer of a group III nitride, and forming a second semiconductor layer of a group III nitride on the first semiconductor layer of the group III nitride.

Also according to the present invention, there is provided a process for manufacturing a semiconductor substrate made of a group III nitride, comprising the steps of:

forming a metal film on a basal substrate having a first semiconductor layer of a group III nitride formed on a base material or a basal substrate comprising a first semiconductor layer of a group III nitride, heat-treating the substrate in an atmosphere containing hydrogen gas or hydrogen-containing compound gas to form voids in the first semiconductor layer of a group III nitride, and forming a second semiconductor layer of a group III nitride on the metal film.

Also according to the present invention, there is provided a process for manufacturing a semiconductor substrate made of a group III nitride, comprising the steps of:

forming a metal film on a basal substrate having a first semiconductor layer of a group III nitride formed on a base material or a basal substrate comprising of a first semiconductor layer of a group III nitride, heat-treating the basal substrate in an atmosphere containing nitrogen gas, oxygen gas or a mixture of nitrogen gas and oxygen gas to form voids in the first semiconductor layer of the group III nitride, and forming a second semiconductor layer of a group III nitride on the metal film.

Also according to the present invention, there is provided a process for manufacturing a semiconductor substrate made of a group III nitride, comprising the steps of:

forming a metal film on a basal substrate having a first semiconductor layer of a group III nitride formed on a base material or a basal substrate consisting of a first semiconductor layer of a group III nitride, heat-treating the basal substrate in an atmosphere containing nitrogen gas or nitrogen-containing compound gas to convert the surface of the metal film into the nitride thereof, heat-treating the substrate in an atmosphere containing hydrogen gas or hydrogen-containing compound gas to form voids in the first semiconductor layer of the group III nitride, and forming a second semiconductor layer of a group III nitride on the metal film.

Also according to the present invention, there is provided a process for manufacturing a semiconductor substrate made of a group III nitride, comprising the steps of:

forming a metal film on a basal substrate having a first semiconductor layer of a group III nitride formed on a base material or a basal substrate comprising a first semiconductor layer of a group III nitride, heat-treating the basal substrate in an atmosphere containing nitrogen gas or nitrogen-containing compound gas and also hydrogen gas or hydrogen-containing compound gas to form voids in the first semiconductor layer of the group III nitride, and also to convert the surface of the metal film into the nitride thereof simultaneously, and forming a second semiconductor layer of a group III nitride on said metal film.

Further, according to the present invention, there is provided a semiconductor substrate made of a group III nitride comprising a basal substrate having a first semiconductor layer of a group III nitride formed on a base material or a basal substrate comprising a first semiconductor layer of a group III nitride, and a second semiconductor layer of a group III nitride formed on said basal substrate, wherein a metal film or a metal nitride film intervenes between said first semiconductor layer of the group III nitride and said second semiconductor layer of the group III nitride, and voids are provided in said first semiconductor layer of the group III nitride.

According to the present invention, there is provided a semiconductor substrate made of a group III nitride comprising a basal substrate having a first semiconductor layer of a group III nitride formed on abase material or a basal substrate comprising a first semiconductor layer of a group III nitride, and a second semiconductor layer of a group III nitride formed on said basal substrate, wherein voids are provided in said first semiconductor layer of a group III nitride, and the percentage of the voids in said first semiconductor layer of a group III nitride is no less than 20% but no more than 90% by volume.

Also according to the present invention, there is provided a semiconductor substrate made of a group III nitride comprising a semiconductor layer of a group III nitride manufactured by forming said semiconductor layer of the group III nitride on a basal substrate having a semiconductor layer containing voids formed on a base material and a metal film or a metal nitride film formed thereon, and then separating said semiconductor layer of the group III nitride from said basal substrate.

In the manufacturing process according to the present invention, a constitution wherein fine holes are formed in the metal film or the metal nitride film as a result of heat treatment may be adopted.

Since the present invention adopts a structure wherein a semiconductor layer of a group III nitrides are layered on the surface of a layer having voids, the present invention exerts the following effects:

Firstly, a semiconductor substrate of a group III nitride having a low defect density and a high crystal quality can be obtained. This is because the layer having voids acts as a strain-relieving layer, which will relieve strain caused by difference in lattice constants or coefficients of thermal expansion between the basal substrate and the second semiconductor layer of the group III nitride.

Secondly, the warp of the obtained semiconductor substrate can be reduced significantly, and thereby the yield in the photolithography step in the device process can be improved. This is because the layer having voids acts as a strain-relieving layer, which will relieve strain caused by difference in lattice constants or coefficients of thermal expansion between the basal substrate and the second semiconductor layer of the group III nitride.

Thirdly, since the basal substrate can be removed easily, a freestanding substrate of a well-shaped GaN single crystal without cracks and faults can be obtained easily. This is because a layer having voids are intervened between the basal substrate and the second semiconductor layer of a group III nitride, and thereby the basal substrate can be removed easily by means of a chemical agent, a mechanical impact or the like.

As a method for forming a GaN layer on a layer having voids, Japanese Patent Laid-Open No. 2000-277435 discloses a method wherein an anti-surfactant region (Si-remaining portion) is formed, and a GaN-based semiconductor is grown on this region while remaining a cavity to reduce dislocation density. In contrast, in the present invention, finer voids are formed densely and uniformly. By forming such voids, since the strain relieving effect becomes more significant, and the chemical agent becomes easier to permeate, it is easier to remove the basal substrate.

Although various methods may be selected for forming voids in a semiconductor layer of a group III nitride, the above-described method wherein the metal film is formed on the first semiconductor layer of the group III nitride, and then the substrate is heat-treated in an atmosphere containing hydrogen gas or a gas of a compound containing hydrogen can be preferably used. Furthermore, the substrate may be heat-treated in an atmosphere containing nitrogen gas, oxygen gas or a mixture thereof. By this heat treatment, the crystal structure of the first semiconductor layer of a group III nitride is decomposed, and component elements, such as nitrogen, will vaporize, resulting in the formation of voids in the layer. According to this method, a porous layer having a structure that can sufficiently relieve strain can be formed stably under good control. In particular, the adequate selection of heat-treatment conditions may attain a desired percentage of voids under good control.

DETAILED DESCRIPTION OF THE INVENTION

Figure 1:
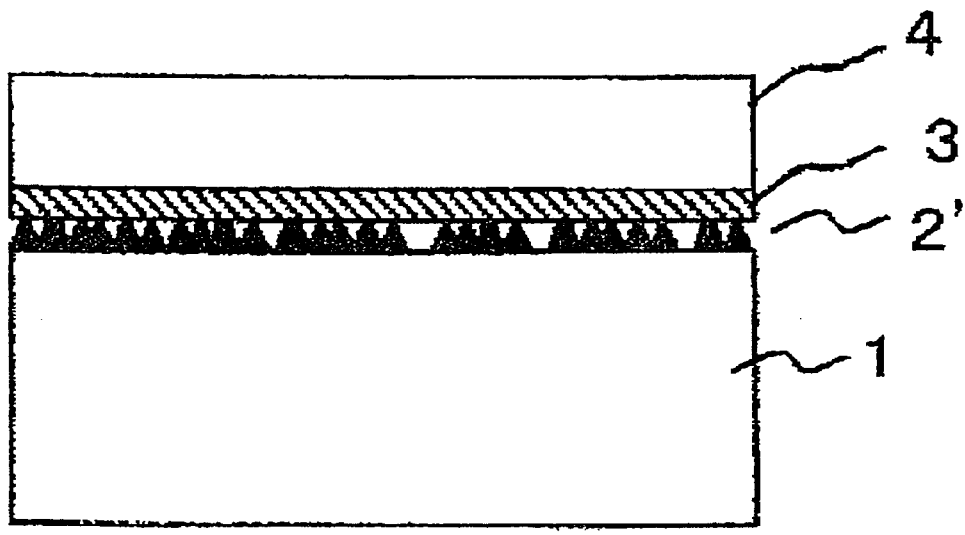
FIG. 1 is a sectional view showing a semiconductor substrate according to the present invention.

The inventors of the present invention founds that when a specific metal, such as titanium, nickel, tantalum, tungsten or the like, is laminated on a semiconductor layer of a group III nitride, and heat treatment is performed in an atmosphere containing hydrogen, voids are formed in the semiconductor layer of a group III nitride. Furthermore, the inventors found that if the surface of a titanium film is converted into its nitride, a single crystal of a semiconductor of a group III nitride can be grown epitaxially thereon.

Since if a film of a metal, such as titanium, is exposed in an atmosphere where a second semiconductor layer of a group III nitride is grown, the surface thereof will suffer nitrification, the specific step for nitrification is not necessarily required to employ; however, it is preferable to independently provide such a step for controlling the degree of nitrification in order to raise the reproducibility of the epitaxial growth of the second semiconductor layer of a group III nitride. Also, titanium can be converted into its nitride at the same time of forming voids by introducing nitrogen gas or a gas of a compound containing nitrogen atoms together with hydrogen gas in the heat treatment ambient for the step of void formation. The first semiconductor layer of a group III nitride having voids has effects to relieve strain caused by difference in lattice constants, and especially in the coefficients of thermal expansion between the sapphire substrate and the second semiconductor layer of a group III nitride, which enables one to reduce defect densities and to fabricate a semiconductor substrate of a group III nitride with little warp. In addition, the film of a metal, such as titanium, helps the formation of voids in the underlying first semiconductor layer of a group III nitride, and at the same time, plays a role as a buffer layer to epitaxially grow a second semiconductor layer of a group III nitride with high crystalline quality thereon.

As methods to deposit the metal film, vapor deposition, sputtering, various CVD techniques, or the like can be utilized. It is preferable that the metal film or the nitrified metal film has a flat surface, and covers the entire surface of the basal substrate; however, even if the film has fine holes, the second semiconductor layer of a group III nitride grown thereon can be grown to cover the holes. In order to reduce the defect density in the growing semiconductor layer of a group III nitride, it may rather be better that fine holes are formed in uniformly scattering manner on the surface of the metal film or the nitrified metal film. The generation of the holes can be controlled by the thickness of the metal film, the thickness of the semiconductor layer of a group III nitride on the sapphire substrate, or the conditions of heat treatment. For example, the heat treatment to nitrify the metal film and to form substantially uniform holes therein is preferably performed at a temperature of no lower than 700° C. but no higher than 1400° C. If the temperature is lower than 700° C., the nitrification reaction does not take place sufficiently, and substantially uniform holes cannot be formed. If the temperature is higher than 1400° C., the thermal decomposition of the single crystalline gallium nitride layer takes place excessively, and the metal nitride film may happen to be peeled. The heat treatment to nitrify the metal film and to form substantially uniform holes is preferably performed in an atmosphere containing nitrogen gas or a gas of a compound containing nitrogen. The reason is that although the nitrification of the metal film takes place only by the reaction with GaN, the heat treatment without using these gases will sometimes cause a fragile metal nitride film, or will allow the metallic Ga formed by the decomposition of GaN to remain on the surface of the metal nitride film.

As methods to grow a semiconductor of a group III nitride in the present invention, various methods including MOCVD (metal-organic vapor phase growth) method, as well as MBE (molecular beam epitaxy), HVPE (hydride vapor phase epitaxy) or the like, can be used. In order to grow a thick semiconductor film of a group III nitride for obtaining a freestanding semiconductor substrate of a group III nitride, the use of HVPE is preferable. This is because its rate of crystal growth is so high that a thick film can be obtained easily, and elsewhere, other methods, such as MOCVD, or the combination of two or more methods may also be used; for example, growing a semiconductor of a group III nitride may be performed by MOCVD method to some thickness, and then may be followed by HVPE method to grow a thick semiconductor layer of a group III nitride. The material of the mask used for selective growth may be any material as long as the crystals of the semiconductor of a group III nitride is not easy to grow thereon, and $SiO_2$ or $SiN_x$, for example, may be used.

The second semiconductor layer of a Group III nitride according to this invention may be formed by using a gas mixture of hydrogen and an inert gas as a carrier gas. The inert gas can include at least one kind selected from $N_2$, He, Ne, Ar, Kr, Xe or Rn.

When such an inert gas as $N_2$ is used as a carrier gas, voids formed in the first semiconductor layer of a group III nitride can be maintained, but the crystalline quality of the second semiconductor layer of a group III nitride will be poor and the internal strain thereof will be increased, leading to more occurrence of cracking, which causes hardness to obtain a freestanding substrate of large scale. On the other hand, when hydrogen is used as a carrier gas, the crystalline quality of the second semiconductor layer of a group III nitride will be good. However, when only hydrogen is used, voids formed in the first semiconductor layer of a group III nitride may tend to be filled up with group III nitride grown at the initial stage of the second layer growth, and thus such an effect to separate easily from the basal substrate may not be attained sufficiently in some cases.

Figure 17:
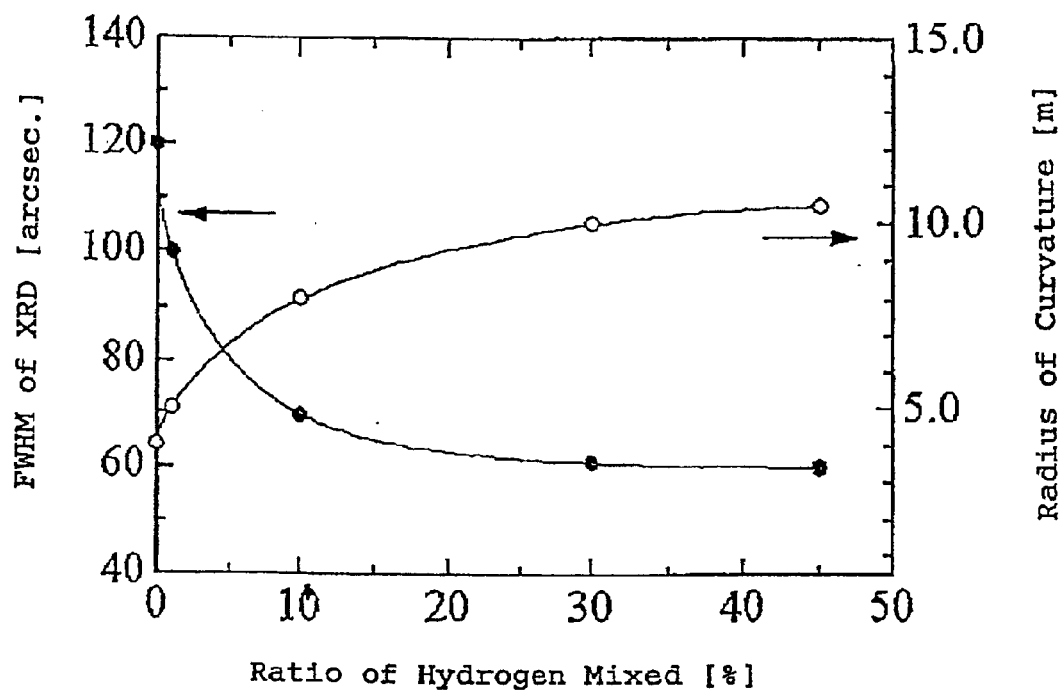
FIG. 17 is a graph showing a full-width at half-maximum (FWHM) observed in X-ray diffraction rocking curve measurement and a radius of curvature of a freestanding GaN substrate plotted against hydrogen containing ratio of mixture used as a carrier gas for crystal growth, in a process according to the present invention.

FIG. 17 shows a typical relation plotting a full-width at half-maximum (FWHM) of X ray Rocking Curve (XRD), which is good indication for crystalline quality, and a radius of curvature of the warp for a freestanding substrate, which is good indication for strain in the crystal, against a ratio (in % by volume) of hydrogen mixed in a carrier gas for preparing the second semiconductor layer of a group III nitride. From the plot, when hydrogen is not contained in the carrier gas (i.e. the ratio of hydrogen mixed is set 0%), it is seen that its FWHM of XRD is larger and its radius of curvature is smaller in comparison to the case where hydrogen is contained. In other words, when hydrogen is not contained in the carrier gas, the crystalline quality is poor, which will result in high probability to generate strain in crystal. When the increased ratio of hydrogen in a carrier gas is selected, the decreased FWHM of XRD is observed, and the increased radius of curvature is obtained. By this way where hydrogen is contained in the carrier gas, the crystalline quality of the second semiconductor layer of a group III nitride can be improved to be good, and the strain in the crystal can be reduced. In particular, it is found that when the ratio of hydrogen mixed in the carrier gas is chosen as no less than 5%, the crystalline quality is improved and the radius of curvature is increased, and thus the practically good freestanding GaN substrate can be obtained.

In this view, the ratio of hydrogen mixed in a carrier gas may be selected preferably as no less than 5% by volume, and more preferably as no less than 10% that is the critical point above which FWHM of XRD is approximately constant. On the other hand, if the ratio of hydrogen mixed in a carrier gas is excessively high, almost of voids formed in the first semiconductor layer of a group III nitride are disappeared, which may affect easy separation of the basal substrate. Therefore, the upper limit for the ratio of hydrogen mixed in a carrier gas is set preferably as no more than 70% by volume, and more preferably as no more than 50%.

Furthermore, when the second semiconductor layer of a group III nitride is formed, such an inert gas as $N_2$ may be used as a carrier gas at the initial stage of growth, but in sequence, the carrier gas may be exchanged to hydrogen to grow a layer having an excellent crystalline quality.

In the present invention, various base materials can be used. For example, substrates of hetero-materials, such as sapphire, silicon, SiC, Langasite($La_3Ga_5SiO_{14}$), Al and GaAs, or substrates consisting of semiconductors of a group III nitride, such as GaN, AlN and AlGaN may be exemplified. When a sapphire substrate is used, the surface for crystal growth may be selected from, for example, a (0001) face or a (1-100) face thereof. When the (0001) face is used, each of the GaN layer, the metal layer, and the nitrified metal layer laminated over can be oriented to the [0001] axis direction if belonged to the hexagonal system or to the [111] axis direction if belonged to the cubic system, respectively, and finally, the GaN epitaxial growth layer lying at the top can be a single crystal with a C-face. In this case, although an off angle is acceptable, it is preferable that the off angle is chosen within 1° from the C axis. If the off angle exceeds 1°, it will affect the orientation of the metal film hardly, and sometimes the single crystal of GaN may be hard to grow on the outermost surface. Also when the (1-100) face of sapphire is used, it is preferable that the off angle is chosen within 1° from that axis.

The basal substrate used in the present invention is:

(i) a substrate comprising a first semiconductor layer of a group III nitride formed on the above-described base material, or (ii) a substrate comprising a first semiconductor layer of a group III nitride.

Specific examples of (i) include a GaN single crystal film formed on a substrate of a hetero-material, such as sapphire, optionally through a low-temperature grown GaN buffer layer. On the other hand, specific examples of (ii) include a freestanding GaN substrate and a freestanding AlGaN substrate. The present invention feature to provide voids in the first semiconductor layer of a group III nitride, and it is preferable to form these voids in the vicinity of the crystal growth surface of the basal substrate. In other words, in the basal substrate of (i), the voids are preferably formed in the first semiconductor layer of the group III nitride; and it is preferable in the substrate of (ii) that the voids are formed in the vicinity of the surface for crystal growth in the first semiconductor layer of the group III nitride.

In the present invention, although the first semiconductor layer of a group III nitride may be one of various semiconductor layers, a semiconductor layer formed from GaN, AlGaN, InGaN or InAlGaN is preferable. Through the selection of such a material, voids can be formed sufficiently in the layer, the percentage of voids can be well controlled, and thereby the stability of manufacturing is improved.

In the present invention, although the thickness of the first semiconductor layer of a group III nitride can be selected optionally depending on detail of the process, it is preferably no less than 10 nm but no more than 5 µm, and more preferably no less than 20 nm but no more than 1 µm. By such a choice, the structure having voids can be formed with good controllability and reproducibility. If its thickness is excessively thin, the control of the percentage of voids may be hard to be controlled in the step for forming the voids. If its thickness is excessively thick, the formation of uniform voids may become difficult, and therefore the strain relieving effect may become not uniform in the surface of the substrate.

It is preferable that the metal film used in the present invention satisfies the following requirements:

(i) The metal film propagates the orientation of the basal substrate, and a semiconductor layer of a group III nitride can be epitaxially grown in a preferable manner on the metal film or the metal nitride film. It is preferable that the metal film or the metal nitride film has a crystal system of the hexagonal or cubic system; and that it can be oriented to the [0001] axis direction if it is of the hexagonal system; or it can be oriented to the [111] axis direction if it is of the cubic system.

(ii) The melting point or the decomposition starting temperature of the metal film or the metal nitride film is higher than the temperature for growing a second semiconductor layer of a group III nitride thereon, and the form of the film can be maintained at the growth temperature.

(iii) The vapor pressure of the metal film or the metal nitride film at the growth temperature where a second semiconductor layer of a group III nitride is grown thereon is sufficiently low, and no sublimation occurs at the growth temperature.

(iv) At the temperature for growing a second semiconductor layer of a group III nitride on the metal film or the metal nitride film, the metal film does not react with the nitride semiconductor, or the starting material gas and the growing atmospheric gas (ammonia gas, hydrogen gas or the like), and thus the above-described orientation of the C axis is not disturbed.

Furthermore, requirements that are preferably satisfied are as follows:

(v) The metal film has catalytic function to accelerate the decomposition of the underlying first semiconductor layer of a group III nitride.

(vi) The ratio of effective lattice mismatching of the metal film or the metal nitride film to the growing semiconductor layer of a group III nitride is small. It is preferable that the ratio of lattice mismatching is 15% or less.

(vii) Difference in the coefficients of linear thermal expansion between the metal film or the metal nitride film and the second semiconductor layer of a group III nitride is small.

By selecting of the metal film satisfying these requirements, voids that can relieve strain and warp effectively can be formed in a preferable manner. The materials that satisfy these requirements include, for example preferred, a metal film containing titanium, nickel, tantalum or tungsten; however, other materials containing scandium, yttrium, zirconium, hafnium, vanadium, niobium, chromium, molybdenum, rhenium, iron, ruthenium, osmium, cobalt, rhodium, iridium, palladium, manganese, copper, platinum or gold can also be used if they can satisfy the essential requirements described above.

When the metal film is formed, and then heat-treated in an atmosphere containing hydrogen gas or a gas of a compound containing hydrogen, fine holes are formed in the metal film, and the evaporation occurs from the first semiconductor layer of a group III nitride through these holes, and thereby voids are formed. By the use of the above-described materials, such holes are adequately formed, and the formation of voids is accelerated. When a metal containing titanium or nickel is selected among the above-described materials, the formation of the voids is particularly accelerated. Although the reason thereof is not clarified, it may be considered because these metals function as catalysts to accelerate the decomposition of the semiconductor of a group III nitride, in particular, a GaN-based semiconductor.

The thickness of the metal film is preferably 1 µm or less, more preferably 300 nm or less, and most preferably 100 nm or less. If the metal film is excessively thick, the surface flatness of the film is lost when the metal film suffers nitrification, resulting in the generation of defects in the second semiconductor layer of a group III nitride grown thereon, and in the worst case, the growth of the single crystal may be inhibited. Although there is no critical lower limit in the thickness of the metal film, the thickness should be, for example, 0.5 nm or more in general.

After the metal film has been formed, the substrate is heat-treated, for example, in an atmosphere containing hydrogen gas or a gas of a hydrogen-containing compound to form voids in the first semiconductor layer of a group III nitride. By this heat treatment, the crystal structure of the first semiconductor layer of a group III nitride is broken out, the constituting elements, such as nitrogen, are vaporized, resulting in the formation of voids in the layer. According to this method, the layer having voids of the structure for sufficiently relieving strain can be formed stably with high-controllability.

The ambient for the treatment is chosen from an atmosphere containing hydrogen gas or a gas of a hydrogen-containing compound. The gas of a hydrogen-containing compound referred to a gas of a compound that contains hydrogen atom(s) in the molecule thereof, for example, such as ammonia, hydrazine, amines, hydrochloric acid and dichlorosilane.

A preferable atmosphere for the treatment is a gas mixture atmosphere containing hydrogen, and, for example, a gas mixture of hydrogen and ammonia is preferably used. Thereby, a desired percentage of voids can be realized stably. However, the use of a gas consisting mainly of ammonia is less preferable. The reason is that since ammonia is used as a gas for growing a group III nitride, if the treatment is carried out in an ammonia atmosphere, the vaporized materials from the first semiconductor layer of a group III nitride may react with ammonia, and its product may adhere on the metal film again, which results in the occurrence of a defective film on growing the second semiconductor layer of a group III nitride on the metal film. Although the gas mixture of hydrogen and ammonia is preferably used, the ratio of ammonia mixing in the gas mixture is preferably 95% or less by volume.

The heat treatment for forming voids is carried out preferably at no lower than 700° C., and more preferably no lower than 800° C. If the temperature is excessively low, the efficiency of void formation may be lowered. The upper limit of the temperature is adequately determined depending on the materials of the film, and in the case of GaN-based materials, the temperature is preferably no higher than 1400° C.

If the heat treatment for nitrifying the metal film is carried out separately from the heat treatment for forming voids, the heat treatment for nitrification is preferably carried out at a temperature of no lower than 500° C. If the temperature for the heat treatment is excessively low, the nitrification reaction to the metal film may not take place sufficiently, and the growth of the second semiconductor layer of a group III nitride may become difficult occasionally.

The percentage of voids in the first semiconductor layer of a group III nitride is preferably no less than 20% but no more than 90% by volume. If the percentage of voids is excessively low, the effect of relieving strain may be lowered, and sometimes the effect of reducing warp and defect density may not be obtained. If the percentage of voids is excessively high, the metal film may be partially peeled when the second nitride has been carried out, it is preferable to carry out the step for forming the second semiconductor layer of a group III nitride on the metal film without removing the substrate out of the apparatus for the above-described heat treatment. Thereby, the cleanliness of the surface of the substrate can be maintained, and epitaxial growth with high purity and few defects can be performed in good reproducibility.

In the present invention, the step of forming a second semiconductor layer of a group III nitride on a metal film may be a step for forming a mask having an opening on the metal film directly or through another layer, and epitaxially growing a semiconductor layer of a group III nitride using this opening as a initial growing region. In this case, the semiconductor layer of a group III nitride is epitaxially grown from the opening of the mask as the starting point, first to cover the opening and sequentially cover the mask, to the entire surface of the substrate. As such a growth method, a method known as ELO for selective lateral growth, or a method known as FIELO for selective mask growth associated with forming a facet structure can be adopted.

In the present invention, after the step of forming a second semiconductor layer of a group III nitride, the step for removing the basal substrate may be carried out. For removing the basal substrate, used can be such a method to apply stress to the first semiconductor layer of a group III nitride having voids, and mechanically separating the basal substrate; or such a method to etch of the metal film or a nitrified metal film for removing the basal substrate.

EXAMPLES

The present invention will be described below in further details referring to examples. In the examples, the mixing ratio of the gas mixture is based on flow rates (by volume).

Example 1

Figure 2:
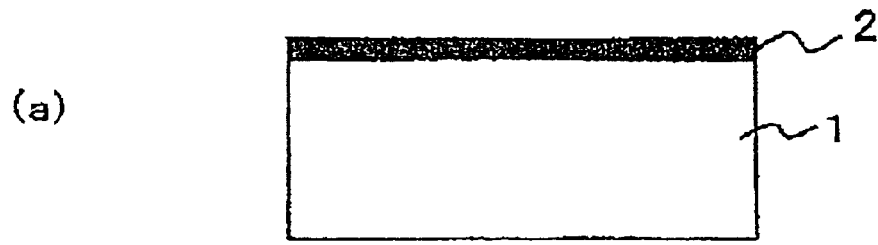
FIG. 2 is sectional views showing the steps of a process for manufacturing a semiconductor substrate according to the present invention.
Figure 2:
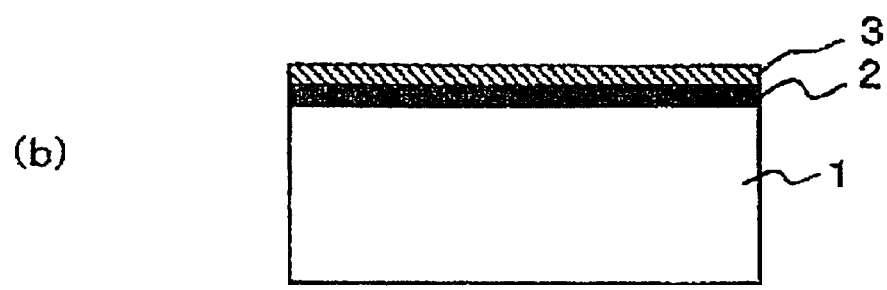
Figure 2:
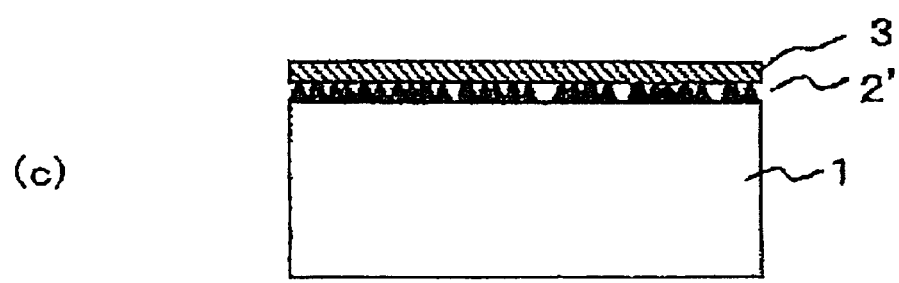
Figure 2:
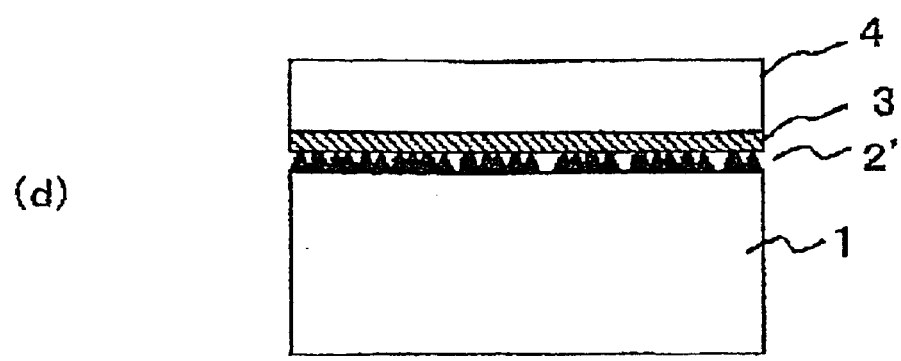

The structure of a semiconductor substrate obtained by the present invention is shown in FIG. 1, and sectional views of the process for manufacturing are shown in FIG. 2. The substrate was prepared by forming an undoped GaN layer 2 to a thickness of 400 nm on the C face ((0001) face) of a single-crystalline sapphire substrate 1 having a diameter of 2 inches, by means of MOCVD method with TMG (trimethyl gallium) and $NH_3$ as starting materials (FIG. 2(a)). A titanium film 3 was vapor-deposited on the epitaxial GaN substrate to a thickness of 20 nm (FIG. 2(b)), and then loaded into the MOCVD chamber and the heat-treatment was carried out at 1050° C. for 20 minutes in the stream of Ar to which 20% $H_2$ was mixed (FIG. 2(c)). Then, in the same chamber, 2 μm of a GaN layer 4 was grown using TMG and ammonia as starting materials on the titanium film 3 at 1050° C. (FIG. 2(d)). Thereby, a semiconductor substrate of a sectional structure as shown in FIG. 1 was obtained.

The surface of the epitaxial GaN substrate obtained thereby was very flat, and microscopic and SEM observations confirmed that its surface morphology was the same as or better than that of a conventional epitaxial GaN substrate grown on a sapphire substrate through a buffer layer grown at a low temperature. The FWHM of diffraction from the GaN (0002) face in the X-ray diffraction measurement for the substrate obtained in this example was about 200 seconds at any location in the substrate, and which verified that this substrate has a good and uniform crystalline quality. Also in the X-ray diffraction measurement, the diffraction peak from the (111) face of titanium nitride was observed, and it was verified that the vapor-deposited titanium was converted into its nitride in the atmosphere for growing GaN crystals.

The surface of the substrate obtained in this example was observed through an atomic force microscope, and the pit density was measured throughout the surface of the substrate. It was verified that the very low pit density was as low as $4 \times 10^7/cm^2$, and that a GaN single crystal of a high crystalline quality was obtained.

The radius of curvature of the warp for this substrate was measured to be about 20 m, and the measurement confirmed that a very flat substrate was formed. On the other hand, if 2 μm of GaN is grown on a sapphire substrate using a conventional method through a buffer layer grown at a low temperature, the radius of curvature of the warp of the substrate will be about 8 m. Thus, it is concluded that the warp for the GaN substrate obtained in this example is significantly reduced.

The substrate was cleaved, and its cross section was observed through an SEM. It was confirmed that a GaN layer 2 having voids was formed on the sapphire substrate, and a flat GaN layer 4 was deposited thereon through a titanium nitride layer 3. The percentage of voids of the GaN layer 2 calculated from the result of observation of the cross section through an SEM was about 50%. The reason why the crystals grown in this example exhibits such a high crystalline quality and flatness is considered to be the intervention of the GaN layer 2' having voids.

Example 2

Figure 7:
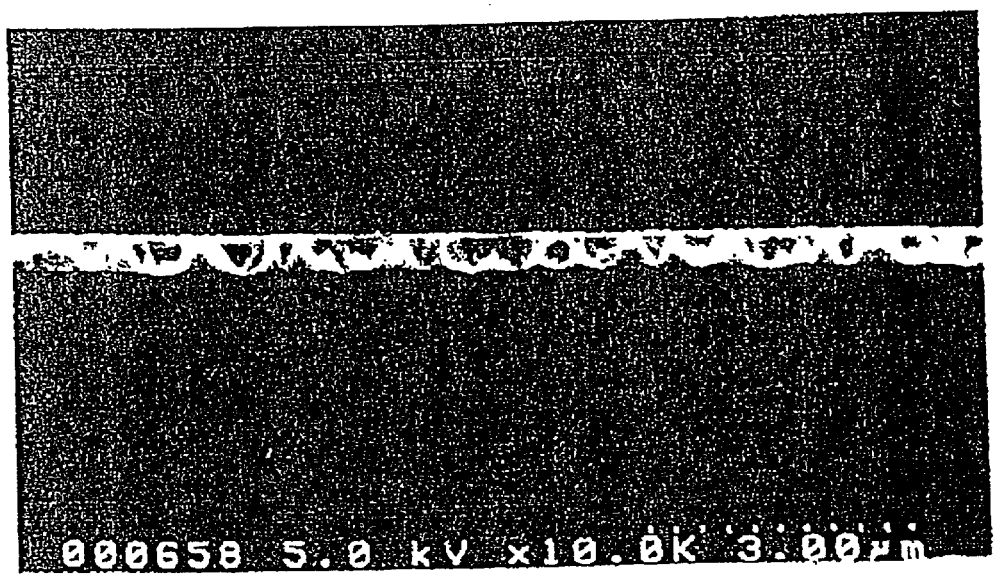
FIG. 7 is a photographical printing-out showing a sectional view of a semiconductor substrate according to the present invention, by means of SEM observation.

In order to confirm that the voids in the GaN layer 2' was formed during the heat treatment of the substrate in Example 1, a substrate whereon titanium was vapor-deposited was heat-treated in the same method as in Example 1, and it was loaded out without growing the GaN layer thereon. Thereafter, the cross section was observed through an SEM. The result of SEM observation for the cross section of the substrate is shown in FIG. 7. It was confirmed from this result that voids same as those observed in Example 1 were formed in the GaN layer 2' on the sapphire substrate.

Example 3

The sectional views of the process of this example are shown in FIG. 2. The substrate was prepared by forming an undoped GaN layer 2 to a thickness of 200 nm on the C face of a single-crystalline sapphire substrate 1 having a diameter of 2 inches, by means of MOCVD method with TMG and $NH_3$ as starting materials (FIG. 2(a)). A titanium film 3 was vapor-deposited on the epitaxial GaN substrate to a thickness of 25 nm (FIG. 2(b)), and then loaded into the MOCVD chamber and the heat-treatment was carried out at 1050° C. for 10 minutes in the stream of Ar to which 20% $H_2$ was mixed (FIG. 2(c)), followed by further heat-treating it at 1050° C. for 30 minutes in the stream of $N_2$. Then, in the same chamber, 2 μm of a GaN layer 4 was grown using TMG and ammonia as starting materials on the titanium film 3 at 1050° C. (FIG. 2(d)).

The surface of the epitaxial GaN substrate obtained thereby was very flat, and microscopic and SEM observations confirmed that its surface morphology was the same as or better than that of a conventional epitaxial GaN substrate grown on a sapphire substrate through a buffer layer grown at a low temperature. The FWHM of diffraction from the GaN (0002) face in the X-ray diffraction measurement for the substrate obtained in this example was about 180 seconds at any position in the substrate, and which verified that this substrate has a good and uniform crystalline quality. Also in the X-ray diffraction measurement, the diffraction peak from the (111) face of titanium nitride was observed, and it was verified that the vapor-deposited titanium was converted into its nitride. The radius of curvature of the warp for this substrate was measured to be about 25 m, and the measurement confirmed that a very flat substrate was formed.

The substrate obtained in this example was cleaved, and its cross-section was observed through an SEM. It was confirmed that a GaN layer 2 having voids was formed on the sapphire substrate 1, and a flat GaN layer 4 was deposited thereon through a titanium nitride layer 3, as shown in FIG. 1 as in the case of Example 1.

When growth by this method was repeated 10 times, good reproducibility was obtained indeed.

Example 4

The sectional views of the process of this example are shown in FIG. 2. The substrate was prepared by forming an undoped GaN layer 2 to a thickness of 500 nm on the C face of a single-crystalline sapphire substrate 1 having a diameter of 2 inches, by means of MOCVD method with TMG and NH$_3$ as starting materials (FIG. 2(a)). A titanium film 3 was vapor-deposited on the epitaxial GaN substrate to a thickness of 30 nm (FIG. 2(b)), and then loaded into the MOCVD chamber and the heat-treatment was carried out at 1050° C. for 30 minutes in the stream of a gas mixture of 80% H$_2$+20% NH$_3$ (FIG. 2(c)). Then, in the same chamber, 1 μm of a GaN layer 4 was grown using TMG and ammonia as starting materials on the titanium film 3 at 1050° C. (FIG. 2(d)).

The surface of the epitaxial GaN substrate obtained thereby was very flat, and microscopic and SEM observations confirmed that its surface morphology was the same as or better than that of a conventional epitaxial GaN substrate grown on a sapphire substrate through a buffer layer grown at a low temperature. The FWHM of diffraction from the GaN (0002) face in the X-ray diffraction measurement was about 180 seconds at any position in the substrate, and which verified that this substrate has a good and uniform crystalline quality.

The surface of the substrate obtained in this example was observed through an atomic force microscope, and the pit density was measured throughout the surface of the substrate. It was verified that the very low pit density was as low as 4×10$^7$/cm$^2$, and that a GaN single crystal substrate of a high crystalline quality was obtained.

The radius of curvature of the warp for this substrate was measured to be about 25 m, and the measurement confirmed that a very flat substrate was formed.

The substrate was cleaved, and its cross section was observed through an SEM. It was confirmed that a GaN layer 2' having voids was formed on the sapphire substrate 1, and a flat GaN layer 4 was deposited thereon through a titanium nitride layer 3, as shown in FIG. 1 as in the case of Example 1.

Example 5

The epitaxial GaN substrate obtained in Example 4 was placed in an HVPE chamber, and 300 μm of GaN was further deposited on the epitaxial GaN layer 4. The starting materials used for HVPE growth were NH$_3$ and GaCl. The growth conditions were chosen as under normal pressure, at a substrate temperature of 1050° C., and in a growth rate of 80 μm/h.

When this substrate obtained was immersed in a mixture liquid of hydrofluoric acid and nitric acid, the layer of titanium 3 (including titanium nitride) was selectively etched off, and the sapphire substrate 1 was separated without breaking or cracking of the GaN layer 4 and the thick GaN layer formed thereon. As a result, a freestanding substrate of the GaN single crystal was obtained.

The radius of curvature of the warp for the GaN single crystal substrate obtained here was measured to be about 3 m, and the measurement confirmed that a very flat substrate was formed. The surface of the GaN single crystal substrate obtained was observed through an atomic force microscope, and the pit density was measured throughout the surface of the substrate. It was verified that the very low pit density was as low as 1×10$^7$/cm$^2$, and that a GaN single crystal substrate of a high crystalline quality was obtained.

Example 6

Figure 3:
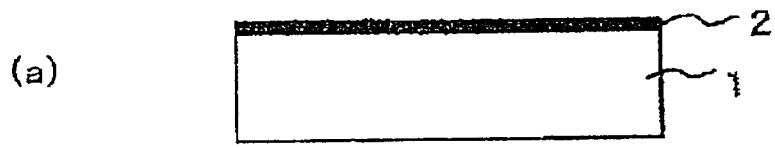
FIG. 3 is sectional views showing the steps in a process for manufacturing a semiconductor substrate according to the present invention.
Figure 3:
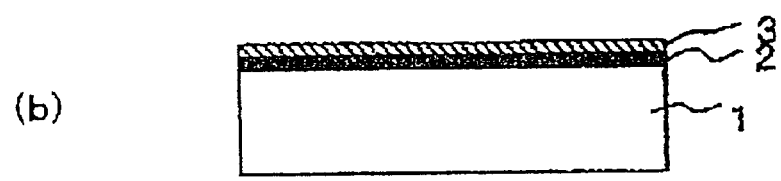
Figure 3:
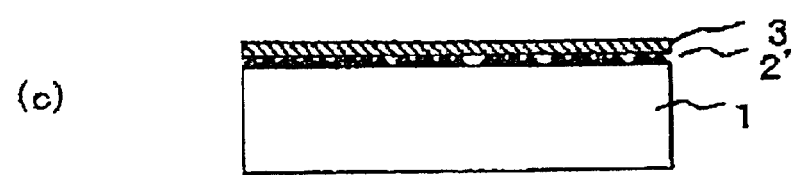
Figure 3:
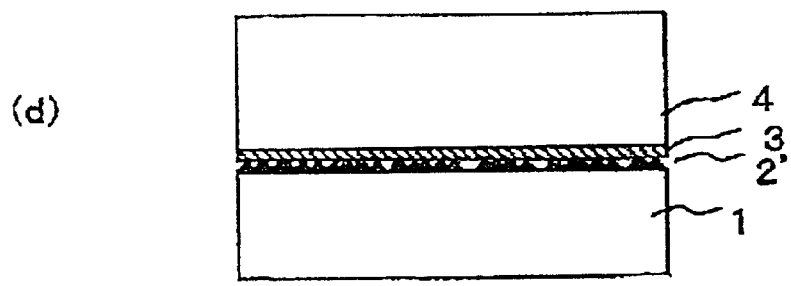
Figure 3:
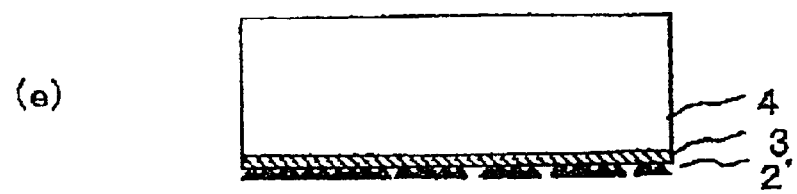
Figure 3:

The substrate was prepared by forming an undoped GaN layer 2 to a thickness of 300 nm on the C face of a single-crystalline sapphire substrate 1 having a diameter of 2 inches, by means of MOCVD method with TMG and NH$_3$ as starting materials (FIG. 3(a)). A titanium film 3 was vapor-deposited on the epitaxial GaN substrate to a thickness of 20 nm (FIG. 3(b)), and then loaded into an HVPE chamber and the heat-treatment was carried out at 1050° C. for 45 minutes in the stream of a gas mixture of 80% H$_2$+20% NH$_3$ (FIG. 3(c)). Then, in the same chamber, 330 μm of an Si-doped GaN layer 4 was grown on the titanium film 3 at 1050° C., using NH$_3$ and GaCl as starting materials and SiH$_3$Cl$_2$ as dopant (FIG. 3(d)).

When thermal shocks of cooling from 600° C. to 200° C. at a rate of 20° C./min were repeatedly applied to the grown substrate, the GaN layer 2' having voids are destroyed due to difference in the coefficients of thermal expansion of sapphire and GaN, and the GaN layer 4 of a thickness of 330 μm was separated from the sapphire substrate 1 (FIG. 3(e)).

Although the rear surface of the GaN layer peeled off was severely rough, when it was polished to remove the layer of titanium 3 (including titanium nitride), a freestanding GaN substrate having both flat top and back surfaces was obtained (FIG. 3(f)).

The substrate heat-treated by the same method as described above was put out of the chamber, and its cross section was observed through an SEM. The percentage of voids in the GaN layer 2' was found to be 60 to 70%. The X-ray diffraction measurement of the surface was performed, and the peak of titanium nitride (111) diffraction was also observed. This confirmed that the nitrification of the titanium layer 3 as well as the formation of voids in the GaN layer 2 was induced. It was observed that the surface of the titanium nitride layer 3 was substantially flat, but numberless fine pores were formed therein.

Example 7

Figure 4:
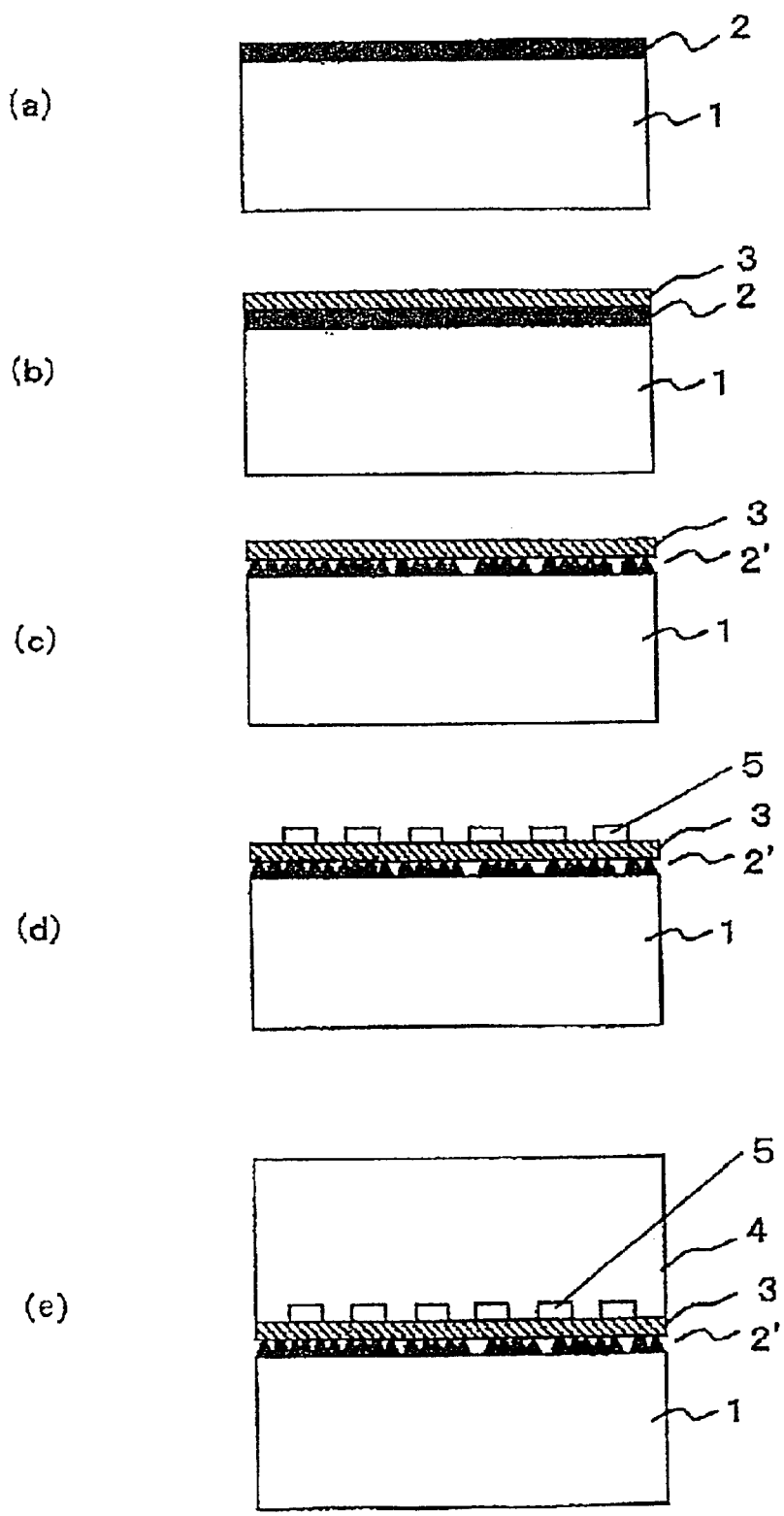
FIG. 4 is sectional views showing the steps in a process for manufacturing a semiconductor substrate according to the present invention.

The sectional views of the process of this example are shown in FIG. 4. The substrate was prepared by forming an undoped GaN layer 2 to a thickness of 300 nm on the C face of a single-crystalline sapphire substrate 1 having a diameter of 2 inches, by means of MOCVD method with TMG and NH$_3$ as starting materials (FIG. 4(a)). A titanium film 3 was vapor-deposited on the epitaxial GaN substrate to a thickness of 25 nm (FIG. 4(b)), and then loaded into an electric furnace and the heat-treatment was carried out at 1050° C. for 20 minutes in the stream of a gas mixture of H$_2$ and NH$_3$ in equal ratio, followed by further heat-treating it at 1050° C. for 30 minutes in the stream of N$_2$ (FIG. 4(c)).

Next, a GaN layer 4 was grown using FIELO method. First, 0.5 μm of an SiO$_2$ film was deposited on the substrate by thermal CVD method, a stripe opening was formed in the SiO$_2$ film in parallel to <11-20> in the step of photolithography to expose the titanium nitride layer 3 and to form a mask 5 (FIG. 4 (d)). The width of the opening was 3 μm, and the width of the mask was 7 μm. This substrate was loaded into an MOCVD chamber, and 4 μm of a GaN layer 4 was grown from TMG and NH$_3$ at a substrate temperature of 1050° C. (FIG. 4(e)). Initially, GaN was selectively grown forming a facet on titanium nitride in the opening; covered the entire surface through lateral growth on the mask 5 once the groove of the mask had been filled; and finally, a GaN layer 4 having a flat surface was formed. The surface of the epitaxial substrate of GaN single crystal obtained thereby was observed through an atomic force microscope, and the pit density was measured throughout the surface of the substrate. It was verified that the very low pit density was as low as 2×10$^7$/cm$^2$, and that an epitaxial substrate of a GaN single crystal of a high crystalline quality was obtained.

Example 8

Figure 5:
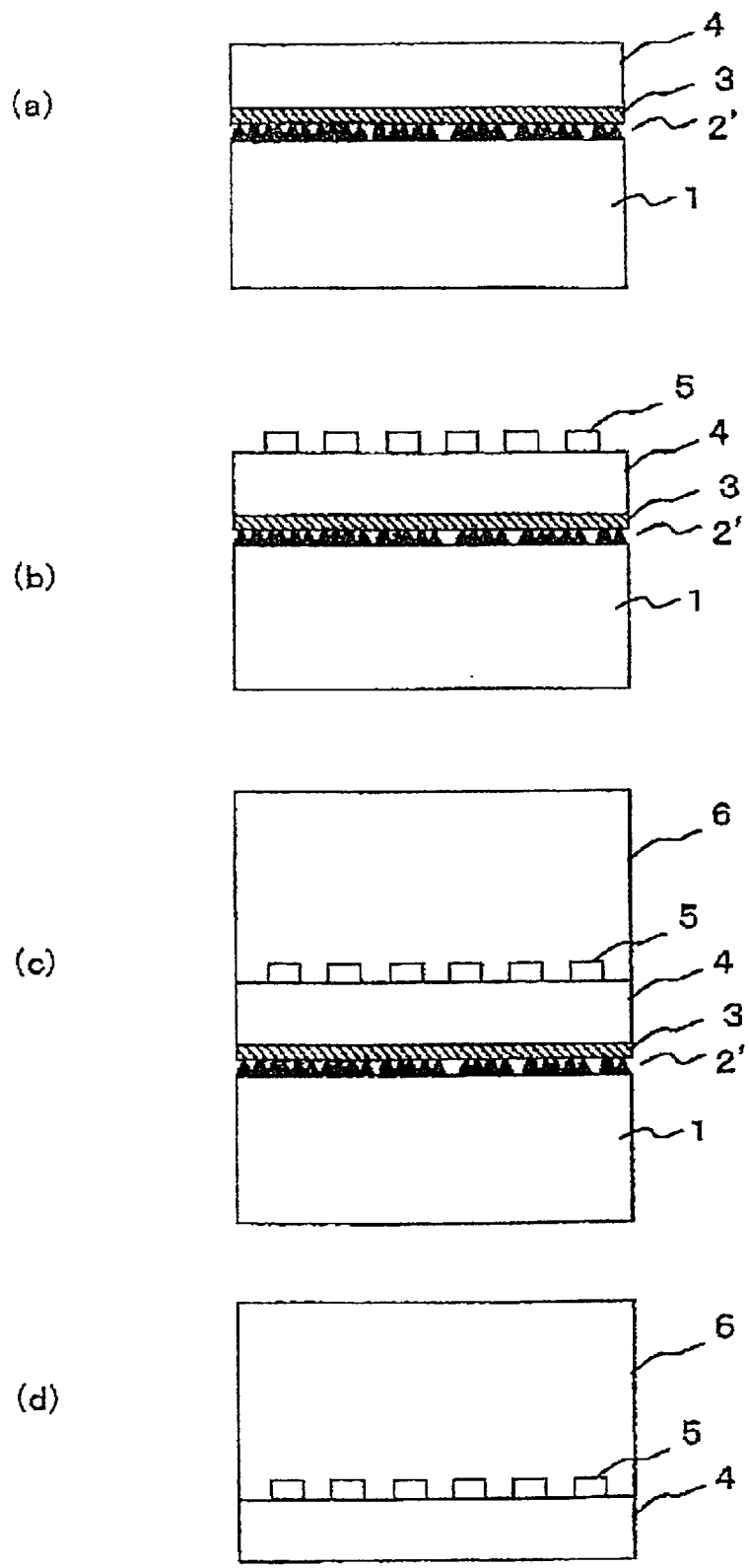
FIG. 5 is sectional views showing the steps in a process for manufacturing a semiconductor substrate according to the present invention.

The sectional views of the process of this example are shown in FIG. 5. First, the steps up to FIG. 5(a) were carried out in the same manner as in Example 4 to obtain an epitaxial GaN substrate. Next, 0.5 μm of an SiO$_2$ film was deposited thereon by thermal CVD method, a stripe opening was formed in the SiO$_2$ film in parallel to <11-20> by the step of photolithography to expose the GaN layer 4 and to form a mask 5 (FIG. 5(b)). The width of the opening was 3 μm, and the width of the mask was 7 μm. This substrate was loaded into an HVPE chamber, and 300 μm of a GaN layer 6 was grown using GaCl and NH$_3$ as starting materials (FIG. 5(c)). The growth conditions were chosen as under normal pressure, at a substrate temperature of 1050° C., and in a growth rate of 80 μm/h. Initially, GaN was selectively grown forming a facet on GaN 4 in the opening; covered the entire surface through lateral growth on the mask 5 once the groove of the mask had been filled; and finally, a GaN layer 6 having a flat surface was formed (FIG. 5(c)) When the substrate obtained was immersed in a mixture liquid of hydrofluoric acid and nitric acid, the titanium nitride layer 3 was selectively etched off, and the GaN layer 4 with the thick GaN layer 6 were separated from the sapphire substrate 1 without breaking or cracking of the GaN layer. As a result, a freestanding substrate of the GaN single crystal was obtained (FIG. 5(d)).

The surface of the obtained substrate of GaN single crystal was observed through an atomic force microscope, and the pit density was measured throughout the surface of the substrate. It was verified that the very low pit density was as low as 6×10$^6$/cm$^2$, and that an epitaxial substrate of a GaN single crystal of a high crystalline quality was obtained. The radius of curvature of the warp of the substrate was about 5 m, indicating an excellent flatness.

Comparative Example 1

Figure 6:
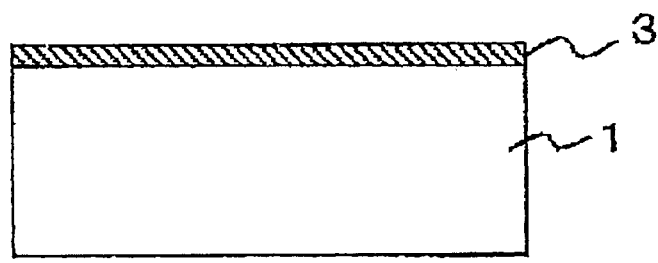
FIG. 6 is sectional views showing the steps in a process for manufacturing a semiconductor substrate.
Figure 6:
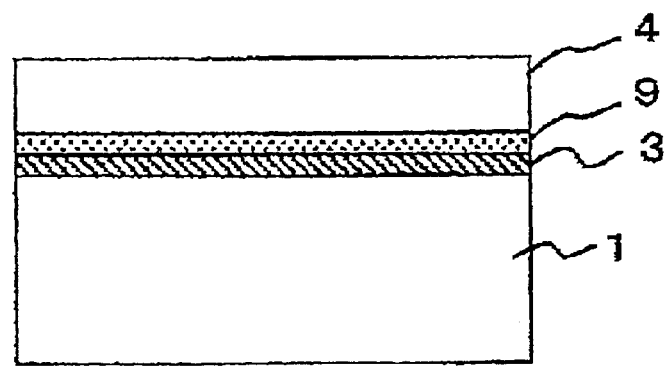
Figure 6:

The sectional views of the process of this comparative example are shown in FIG. 6. On the substrate 1 of the C face of the single crystalline sapphire having a diameter of 2 inches, a titanium film 3 of a thickness of 0.1 μm was vapor-deposited (FIG. 6(a)), and a gold film 9 of a thickness of 10 to 20 nm for preventing oxidation was vapor-deposited thereon.

This substrate was loaded into an MBE (molecular beam epitaxy) chamber, and a GaN layer 4 of a thickness of 2 μm was grown at 700° C. on the substrate 1 (FIG. 6(b)).

When the substrate removed out of the MBE chamber was immersed in hydrofluoric acid, the titanium layer 3 was selectively etched off, and thus the GaN layer 4 was separated from the sapphire substrate 1 (FIG. 6(c)). However, more time was required for the separation of the substrate compared with the above-described examples.

The epitaxial GaN layer obtained thereby remained warped to a large extent by the thermal strain introduced during growth and lattice mismatching thereof, and thus it was incidentally rolled up when it was peeled off from the substrate 1. freestanding substrate of the GaN single crystal was obtained (FIG. 5(d)).

The surface of the obtained substrate of GaN single crystal was observed through an atomic force microscope, and the pit density was measured throughout the surface of the substrate. It was verified that the very low pit density was as low as 6×10$^6$/cm$^2$, and that an epitaxial substrate of a GaN single crystal of a high crystalline quality was obtained. The radius of curvature of the warp of the substrate was about 5 m, indicating an excellent flatness.

Comparative Example 1

The sectional views of the process of this comparative example are shown in FIG. 6. On the substrate 1 of the C face of the single crystalline sapphire having a diameter of 2 inches, a titanium film 3 of a thickness of 0.1 μm was vapor-deposited (FIG. 6(a)), and a gold film 9 of a thickness of 10 to 20 nm for preventing oxidation was vapor-deposited thereon.

This substrate was loaded into an MBE (molecular beam epitaxy) chamber, and a GaN layer 4 of a thickness of 2 μm was grown at 700° C. on the substrate 1 (FIG. 6(b)).

When the substrate removed out of the MBE chamber was immersed in hydrofluoric acid, the titanium layer 3 was selectively etched off, and thus the GaN layer 4 was separated from the sapphire substrate 1 (FIG. 6(c)). However, more time was required for the separation of the substrate compared with the above-described examples.

The epitaxial GaN layer obtained thereby remained warped to a large extent by the thermal strain introduced during growth and lattice mismatching thereof, and thus it was incidentally rolled up when it was peeled off from the substrate 1.

It was clarified from the comparison of this comparative example with the above-described examples, that the provision of a layer having voids on the substrate facilitated the separation of the substrate, and reduced the warp of the substrate significantly. Besides, in examples 1 to 8 mentioned above, a GaN layer 4 was grown using He as a carrier gas.

Example 9

Figure 8:
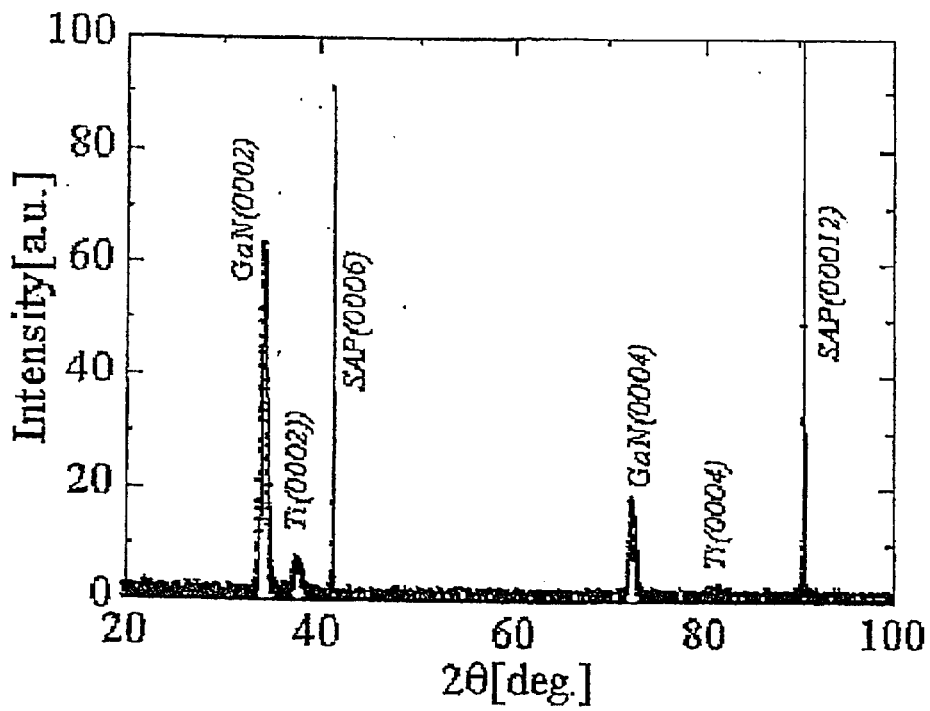
FIG. 8 is a graph showing a result of X-ray diffraction measurement of a substrate obtainable by the process of example, according to the present invention.
Figure 9:
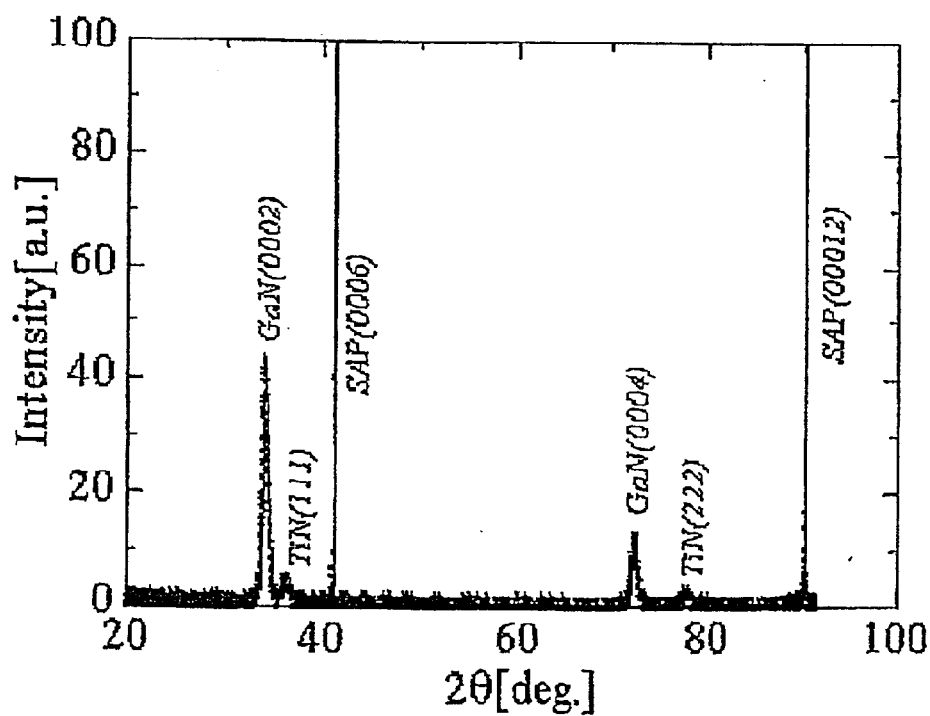
FIG. 9 is a graph showing a result of X-ray diffraction measurement of another substrate obtainable by the process of example, according to the present invention.
Figure 12:
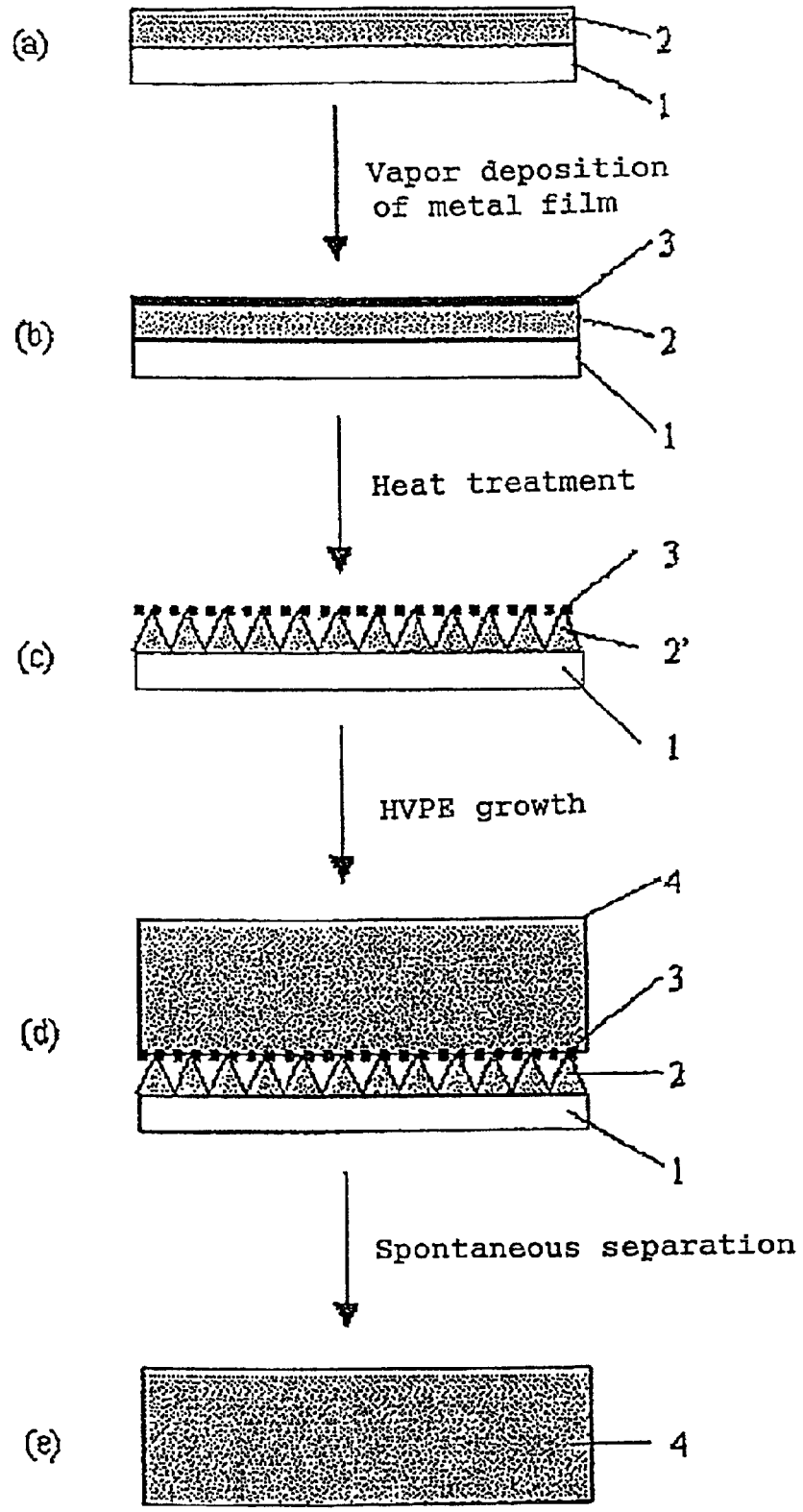
FIG. 12 is sectional views showing the steps in a process for manufacturing a semiconductor substrate according to the present invention.

This example will be described below referring to FIG. 12. The substrate was prepared by forming an undoped GaN layer 2 to a thickness of 500 nm on the C face of a single-crystalline sapphire substrate 1 having a diameter of 2 inches, by means of MOCVD method with TMG and NH$_3$ as starting materials (FIG. 12(a)). A titanium film 3 was vapor-deposited on the epitaxial GaN substrate to a thickness of 20 nm (FIG. 12(b)). The result of the X-ray diffraction measurement of the Ti-deposited substrate is shown in FIG. 8. The orientation of Ti in the [0001] direction was observed on the epitaxial GaN substrate. This substrate was put in an electric furnace, and the heat-treatment was carried out at 1070° C. for 30 minutes in the stream of H$_2$ to which 25% ammonia was added. When the X-ray diffraction measurement of the heat-treated substrate was performed, the diffraction peak from TiN was observed as illustrated in FIG. 9, and it was confirmed that the titanium film 3 was converted to a titanium nitride film oriented in the [111] direction.

Figure 10:
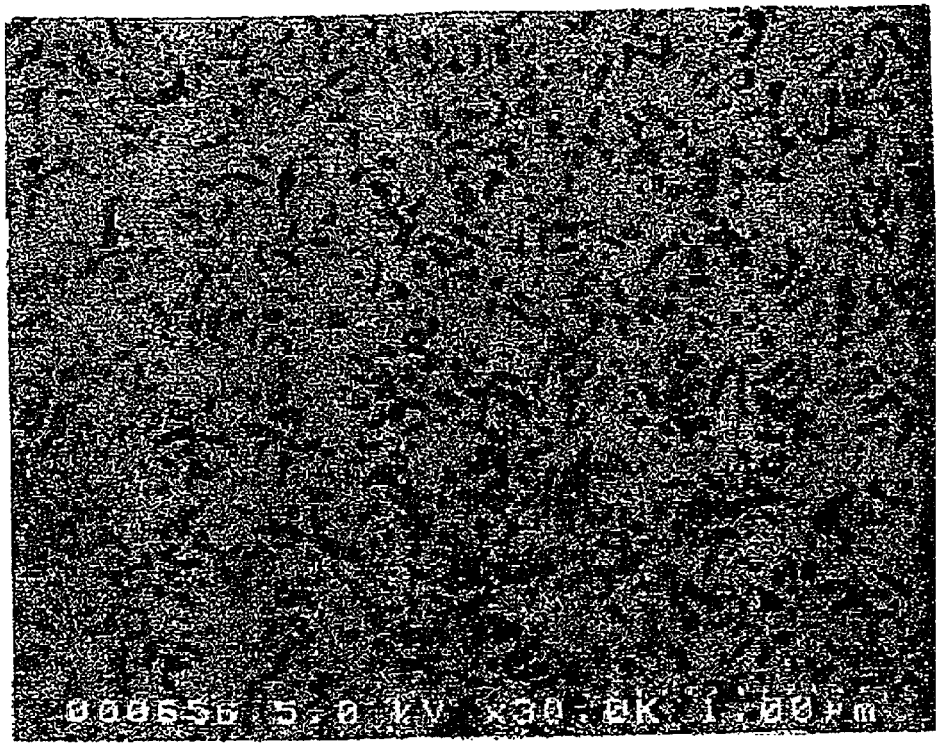
FIG. 10 is a photographical printing-out showing a SEM observation view of surface morphology of TiN top layer obtainable by the process of example 9, according to the present invention.
Figure 11:
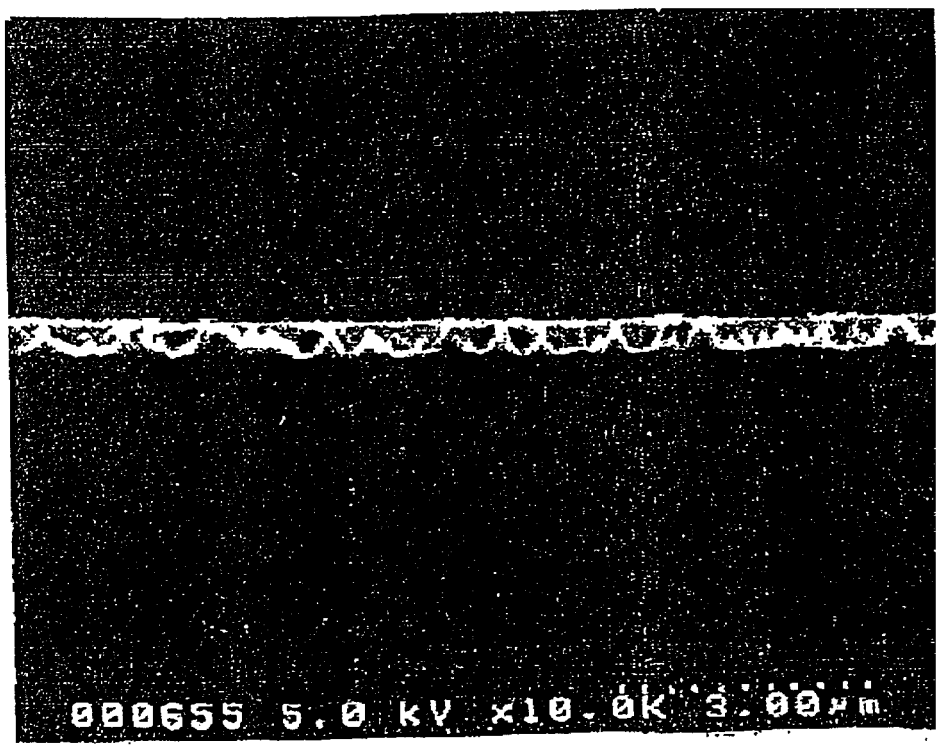
FIG. 11 is a photographical printing-out showing a SEM observation view of section of a basal substrate obtainable by the process of example 9, according to the present invention.

The observation for the surface and cross section thereof through an SEM exhibited such structures as shown in FIGS. 10 and 11, respectively. Specifically, its sectional structure was that fine holes of a sub-micron order were uniformly opened on the surface of the titanium layer 3, voids of depths up to 500 nm are formed in the underlying GaN layer 2, and the titanium layer 3 was supported by the apexes of the remaining GaN layer 2 in triangular form (FIG. 12(c)). The percentage of voids estimated from the sectional SEM photograph was about 65%. This substrate was loaded into an HVPE chamber, and 300 μm of GaN 4 was deposited (FIG. 12(d)). Starting materials used for growth were NH$_3$ and GaCl. The partial pressures of GaCl and NH$_3$ contained in the supply gas were $8 \times 10^{-3}$ atm and $8 \times 10^{-2}$ atm, respectively. GaN was grown under normal pressure at a temperature of 1040° C. N$_2$ was used as the carrier gas. The reason for the selection of N$_2$ as the carrier gas was to accelerate lateral growth and thereby to prevent voids in the underlying GaN layer from being filled. The similar effects are obtained also by using inert gases such as Ar and He. Alternatively, an inert gas, such as N$_2$, Ar, and He, may be used initially as a carrier gas to grow GaN of a thickness enough to cover the surface, for example, about 20 μm, and then the carrier gas may be switched to H$_2$ to grow GaN up continuously to obtain a thick GaN layer 4. For instance, the GaN layer 4 were grown up to a total thickness of 300 μm by growth step using the H$_2$ carrier gas, where the partial pressures of GaCl and NH$_3$ contained in the supply gas were chosen to be $1 \times 10^{-2}$ atm and $2.5 \times 10^{-1}$ atm, respectively. Compared with the surface of the GaN layer 4 grown entirely using the N$_2$ carrier gas, the reduce of irregular grain-growth and the improvement of surface morphology were found in the surface of the GaN layer 4 obtained in the combination manner. The GaN layer 4 was automatically separated from the sapphire substrate 1 of the C face at the void layer during the step for cooling after the completion of growth, and a freestanding GaN substrate was obtained (FIG. 12(e)).

The surface of the obtained freestanding GaN substrate 4 was very flat, and microscopic and SEM observations confirmed that its surface morphology was the same as or better than that of a conventional GaN layer grown on a sapphire substrate through a buffer layer grown at a low temperature. The FWHM of diffraction from the GaN (0002) face and (10-10) face in the X-ray diffraction measurement were about 120 arcseconds and 150 arcseconds, respectively, at any location in the substrate, and which verified that this substrate has a good and uniform crystalline quality. The radius of curvature of the warp for the GaN single crystal substrate obtained here was measured to be about 4 m, and the measurement confirmed that a very flat substrate was formed. If 300 μm of GaN is grown on a sapphire substrate by conventional methods, the radius of curvature of the warp of the substrate is about 50 cm; therefore, it is concluded that the warp of the GaN substrate obtained by this method is significantly reduced. Also, etch pits generated by immersing the sample in a hot mixture liquid of phosphoric acid and sulfuric acid (250° C.) were observed, and the dislocation density measured for the freestanding GaN single crystal substrate obtained here was found to be as small as $1 \times 10^7/$cm$^2$. When the density of pits on the surface was measured also through an atomic force microscope, the value measured was as small as $8 \times 10^6/$cm$^2$, and it was verified that a GaN single crystal substrate of a high crystalline quality was obtained.

Example 10

This example, in which Pt was used for the metal film in similar manner to Example 9, will be described below referring to FIG. 12. The substrate was prepared by forming an undoped GaN layer 2 to a thickness of 1 μm on the C face of a single-crystalline sapphire substrate 1 having a diameter of 2 inches, by means of MOCVD method with TMG and NH$_3$ as starting materials (FIG. 12(a)). A Pt metal film 3 was vapor-deposited on the GaN layer 2 to a thickness of 20 nm (FIG. 12(b)). It was put in an electric furnace, and then heat-treated at 850° C. for 20 minutes in the air. As a result, voids were formed in high density in the GaN layer 2, and holes of sub-micron sizes were formed in high density on the Pt metal film (FIG. 12(c)).

This crystal was loaded into an HVPE chamber, and 300 μm of GaN 4 was deposited (FIG. 12(d)). Starting materials used for growth were NH$_3$ and GaCl. The partial pressures of GaCl and NH$_3$ contained in the supply gas were $8 \times 10^{-3}$ atm and $8 \times 10^{-2}$ atm, respectively. Growth was carried out under normal pressure at a temperature of 1040° C. Ar was used as the carrier gas, but other inert gases such as N$_2$ and He may also be used instead of Ar. In addition, as in Example 9, two-stage growth procedure, wherein an inert gas, such as N$_2$, Ar, and He, is used as a carrier gas for the initial stage to grow GaN up to about 50 μm, and then it is switched to a carrier gas containing H$_2$ for second stage to grow GaN continuously up to a desired thickness, may also be selected. The reduction of irregular grain-growth and the improvement of surface morphology will be attained by such approach. In this example, a GaN layer 4 of the thickness of 250 μm was grown. The GaN layer 4 was automatically separated from the sapphire substrate 1 of the C face at the void layer during the step for cooling after the completion of growth, and a freestanding GaN substrate was obtained (FIG. 12(e)).

The surface of the obtained freestanding GaN substrate 4 was very flat, and microscopic and SEM observations confirmed that its surface morphology was the same as or better than that of a conventional GaN layer grown on a sapphire substrate through a buffer layer grown at a low temperature. The FWHM of diffraction from the GaN (0002) face and (10-10) face in the X-ray diffraction measurement were about 100 arcseconds and 130 arcseconds, respectively, at any location in the substrate, and which verified that this substrate has a good and uniform crystalline quality. The radius of curvature of the warp for the GaN single crystal substrate obtained here was measured to be about 5 m, and the measurement confirmed that a very flat substrate was formed. If 300 μm of GaN is grown on a sapphire substrate by conventional methods, the radius of curvature of the warp of the substrate is about 50 cm; therefore, it is concluded that the warp of the GaN substrate obtained by this method is significantly reduced. Also, etch pits generated by immersing the sample in a hot mixture liquid of phosphoric acid and sulfuric acid (250° C.) were observed, and the dislocation density measured for the freestanding GaN single crystal substrate obtained here was found to be as small as $5 \times 10^6$/ $cm^2$. When the density of pits on the surface was measured also through an atomic force microscope, the value measured was as small as $5 \times 10^6/cm^2$, and it was verified that a GaN single crystal substrate of a high crystalline quality was obtained.

Example 11

Figure 13:
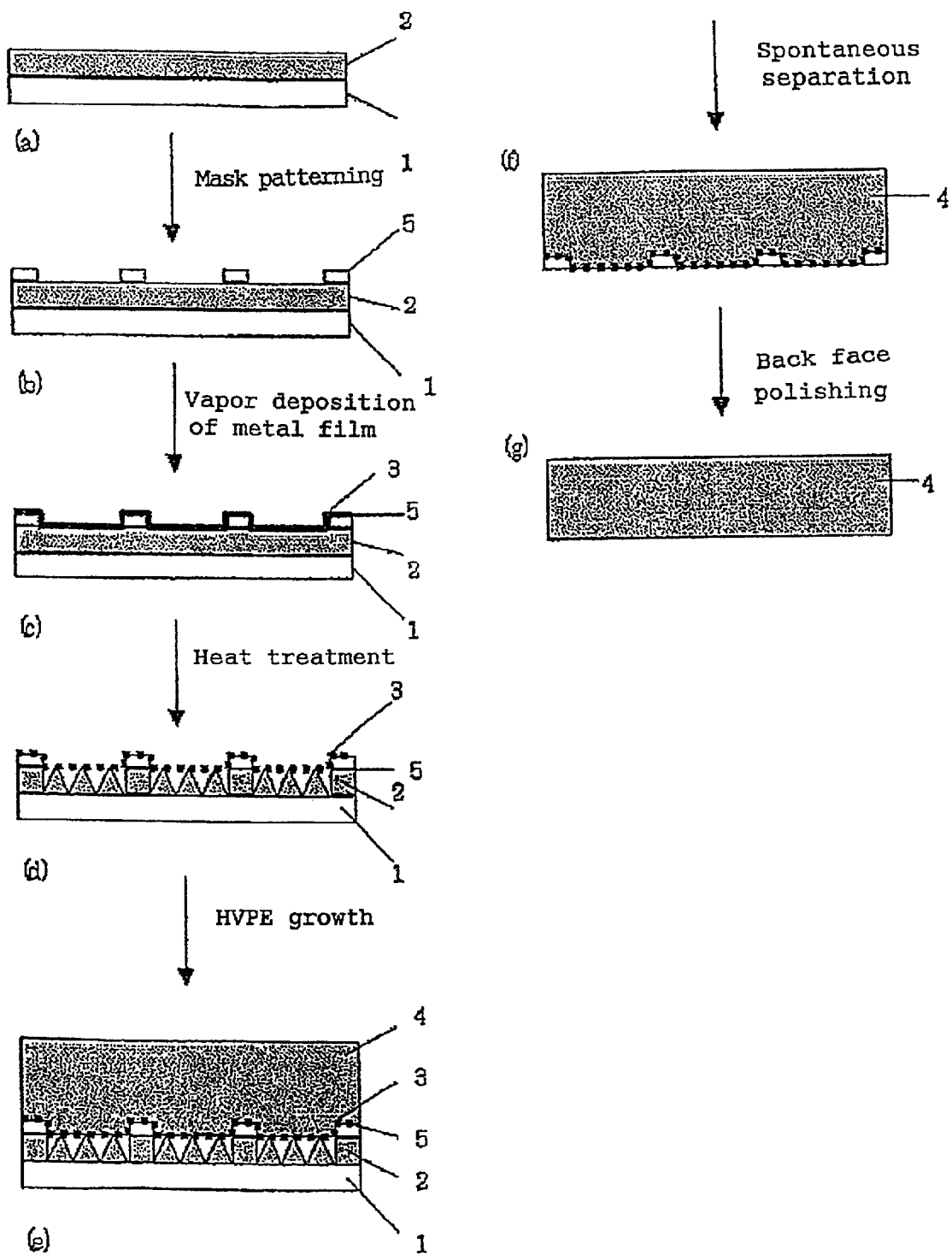
FIG. 13 is sectional views showing the steps in a process for manufacturing a semiconductor substrate according to the present invention.

Further example according to this invention will be described below referring to FIG. 13.

The substrate was prepared by forming a GaN layer 2 to a thickness of 300 nm on the C face of a single-crystalline sapphire substrate 1 having a diameter of 2 inches, by means of MOCVD method with TMG and $NH_3$ as starting materials (FIG. 13(a)).

On this substrate, 0.5 $\mu$m of an $SiO_2$ film was deposited by thermal CVD method, a stripe opening was formed in the $SiO_2$ film in parallel to <11-20> by the step of photolithography to expose the GaN layer 2 and to form a mask 5 (FIG. 13(b)). The width of the opening was 3 $\mu$m, and the width of the $SiO_2$ mask 5 was 7 $\mu$m.

A titanium film 3 was vapor-deposited on the epitaxial GaN substrate to a thickness of 25 nm (FIG. 13(c)), and then loaded into an HVPE chamber and the heat-treatment was carried out at 1050° C. for 20 minutes in the stream of a gas mixture of $H_2$ and $NH_3$ in equal ratio, followed by further heat-treating it at 1050° C. for 30 minutes in the stream of $H_2$. As a result, voids were formed in high density in the GaN layer 2 (FIG. 13(d)), the Ti layer 3 was converted into TiN by nitrification, and fine holes of a sub-micron order were formed in high density on its surface. Sequentially, in the same chamber, 300 $\mu$m of GaN 4 was deposited. Starting materials used for growth were $NH_3$ and GaCl, and He was used as the carrier gas. The partial pressures of GaCl and $NH_3$ contained in the supply gas were $8 \times 10^{-3}$ atm and $8 \times 10^{-2}$ atm, respectively. Growth was carried out under normal pressure at a temperature of 1050° C. Initially, GaN was selectively grown in the opening; covered the entire surface through lateral growth on the mask when the window of the mask had been filled; and finally, a GaN layer 4 having a flat surface was formed (FIG. 13(e)). Other inert gases such as $N_2$ and Ar may also be used instead of He. In this growth, the two-stage growth procedure, wherein an inert gas, such as $N_2$, Ar, and He, is used as a carrier gas for the initial stage to cover the entire surface with GaN grown through lateral growth, and then it is switched to a carrier gas containing $H_2$ for second stage to grow GaN continuously up to a desired thickness, may also be applied. The reduction of irregular grain-growth and the improvement of surface morphology will be attained by such approach. The GaN layer 4 was automatically separated from the sapphire substrate 1 at the void layer during the step for cooling after the completion of growth (FIG. 13(f)). Polishing to remove the roughness of the back of the separated GaN layer 4 was carried out, and and thereby a part of the GaN layer 4 including the titanium layer 3 and the $SiO_2$ mask 5 is removed to obtain a freestanding GaN substrate of which both the top and back surfaces were flat (FIG. 13(g)).

The surface of the obtained freestanding GaN substrate 4 was very flat, and microscopic and SEM observations confirmed that its surface morphology was the same as or better than that of a conventional GaN layer grown on a sapphire substrate through a buffer layer grown at a low temperature. The FWHM of diffraction from the GaN (0002) face and (10-10) face in the X-ray diffraction measurement were about 60 arcseconds and 80 arcseconds, respectively, at any location in the substrate, and which verified that this substrate has a good and uniform crystalline quality. The radius of curvature of the warp for the GaN single crystal substrate obtained here was measured to be about 7 m, and the measurement confirmed that a very flat substrate was produced. If 300 $\mu$m of GaN is grown on a sapphire substrate by conventional methods, the radius of curvature of the warp of the substrate is about 50 cm; therefore, it is concluded that the warp of the GaN substrate obtained by this method is reduced to a great extent. Also, etch pits generated by immersing the sample in a hot mixture liquid of phosphoric acid and sulfuric acid (250° C.) were observed, and the dislocation density measured for the freestanding GaN single crystal substrate obtained here was found to be as small as $2 \times 10^6/cm^2$. When the density of pits on the surface was measured also through an atomic force microscope, the value measured was as small as $2 \times 10^6/cm^2$, and it was verified that a GaN single crystal substrate of a high crystalline quality was obtained.

Example 12

Figure 14:
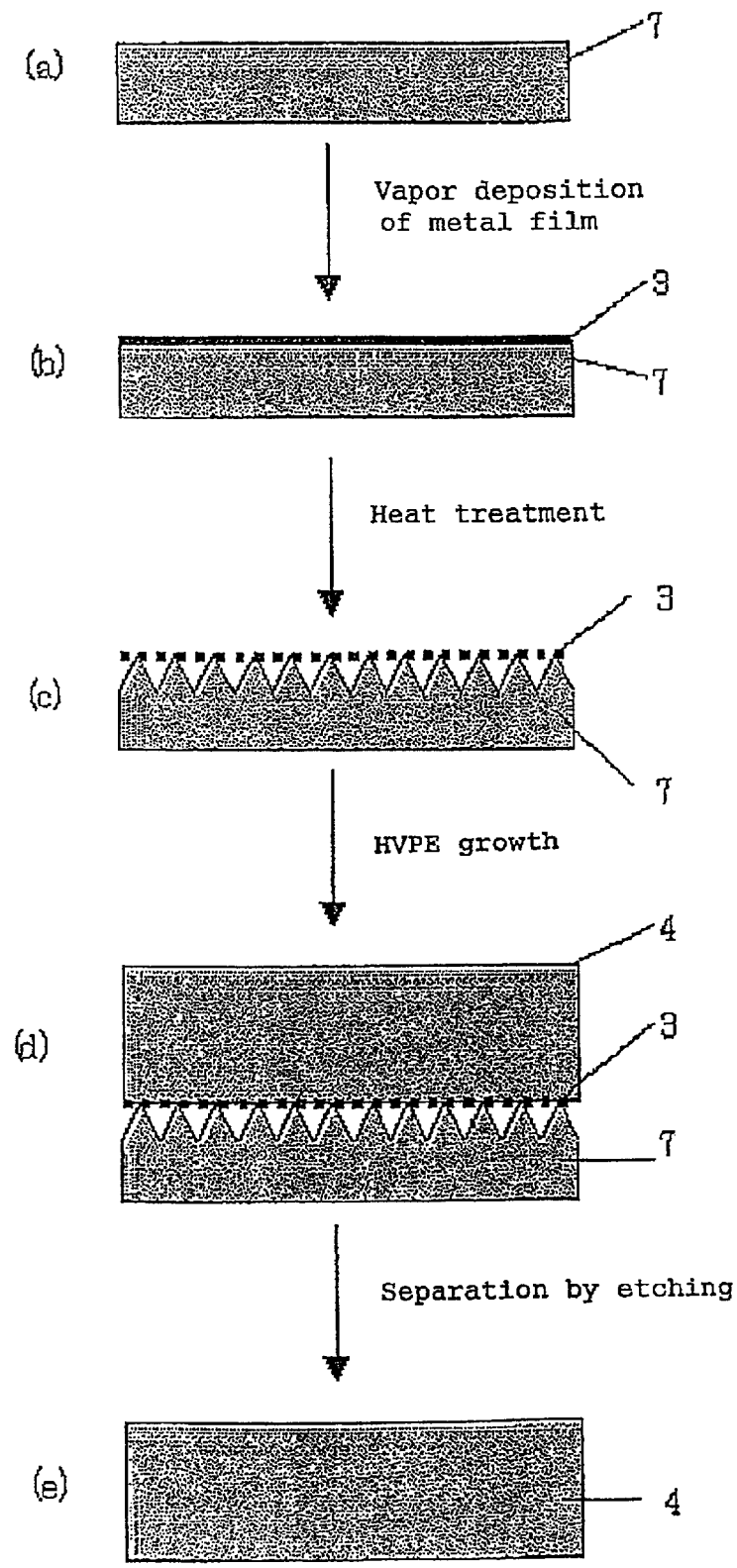
FIG. 14 is sectional views showing the steps in a process for manufacturing a semiconductor substrate according to the present invention.

On a GaN single crystal substrate 7, 20 nm of a titanium film 3 was vapor-deposited (FIG. 14(a), (b)). This substrate was placed in an electric furnace, and heat-treated at 1100° C. for 30 minutes in the stream of $H_2$ to which 25% ammonia was mixed. When the surface and cross section thereof were observed through an SEM, fine holes of a sub-micron order were evenly formed on the surface of the titanium layer 3, voids of depths of about 500 nm are formed in the underlying GaN layer 2, and the sectional structure was that the titanium layer 3 was supported by the apexes of the remaining triangular GaN crystal 7 (FIG. 14 (c)).

This substrate was placed in an HVPE chamber, and 300 $\mu$m of GaN 4 was deposited thereon (FIG. 14(d)). Starting materials used for growth were $NH_3$ and GaCl. The partial pressures of GaCl and $NH_3$ in the supply gas were $8 \times 10^{-3}$ atm and $8 \times 10^{-2}$ atm, respectively. GaN was grown under normal pressure at a temperature of 1040° C. $N_2$ was used as the carrier gas. The reason for the use of $N_2$ as the carrier gas was to accelerate lateral growth and to prevent voids in the underlying GaN layer from being filled. The same effects may be obtained from inert gases such as Ar and He. Alternatively, an inert gas, such as $N_2$, Ar, and He, may be used initially as a carrier gas to grow GaN of a thickness enough to cover the surface, for example, about 20 $\mu$m, and then the carrier gas may be switched to $H_2$ to grow GaN continuously to obtain a thick GaN layer 4. Compared with the surface of the GaN layer 4 grown using the $N_2$ carrier gas alone, the reduction of irregular grain-growth and the improvement of surface morphology were found in the surface of the GaN layer 4 grown up to a total thickness of 300 $\mu$m using the $H_2$ carrier gas with the partial pressures of GaCl and $NH_3$ in the supply gas of $1 \times 10^{-2}$ atm and $2.5 \times 10^{-1}$ atm, respectively. When the TiN layer 3 was etched off with a mixture liquid of hydrofluoric acid and nitric acid after the completion of growth, the GaN layer 4 was separated from the substrate 7, and a new GaN single crystal substrate 4 was obtained (FIG. 14(e)).

The surface of the obtained substrate of GaN single crystal 4 was very flat, and observation through a microscope and SEM confirmed that its surface conditions were the same as or better than those of a conventional GaN substrate grown on a sapphire substrate through a buffer layer grown at a low temperature. The FWHM of diffraction of the GaN (0002) face and (10-10) face in the X-ray diffraction measurement was about 50 arcseconds and 70 arcseconds, respectively, at any position in the substrate, and verified that this substrate showed good and uniform crystalline quality. The radius of curvature of the warp of the obtained substrate of GaN single crystal 4 was about 8 m, and the measurement confirmed that a very flat substrate was formed. Different from the case where sapphire or the like is used as the basal substrate, the very good flatness was due to the absence of strain caused by difference in lattice constants and coefficients of thermal expansion.

The result of measuring the dislocation density of the obtained GaN single crystal substrate 4 from etch pits formed after immersing the sample in a hot mixture (250° C.) of phosphoric acid and sulfuric acid showed that the density was as small as $7 \times 10^5/cm^2$, and it was verified that a substrate of GaN single crystal with high crystalline quality was obtained.

Example 13

This example will be described below in similar manner to Example 9 referring to FIG. 12. The substrate was prepared by forming an undoped GaN layer 2 to a thickness of 300 nm on the C face of a single-crystalline sapphire substrate 1 having a diameter of 2 inches, by means of MOCVD method with TMG and $NH_3$ as starting materials (FIG. 12(a)). A titanium film 3 was vapor-deposited on the epitaxial GaN substrate to a thickness of 10 nm (FIG. 12(b)). This substrate was put in an electric furnace, and the heat-treatment was carried out at 1070° C. for 30 minutes in the stream of $H_2$ to which 25% ammonia was added. When the X-ray diffraction measurement of the heat-treated substrate was performed, the diffraction peak from TiN was also observed as that mentioned in Example 9, and it was confirmed that the titanium film 3 was converted to a titanium nitride film oriented in the [111] direction.

The observation for the surface and cross section thereof through an SEM exhibited such structures as shown in FIGS. 10 and 11, respectively. Specifically, its sectional structure was that fine holes of a sub-micron order were uniformly opened on the surface of the titanium layer 3, voids of depths up to 300 nm are formed in the underlying GaN layer 2, and the titanium layer 3 was supported by the apexes of the remaining GaN layer 2 in triangular form (FIG. 12(c)). The percentage of voids estimated from the sectional SEM photograph was about 60%. This substrate was loaded into an HVPE chamber, and 300 μm of GaN 4 was deposited (FIG. 12(d)). Starting materials used for growth were $NH_3$ and GaCl. The partial pressures of GaCl and $NH_3$ contained in the supply gas were $8 \times 10^{-3}$ atm and $8 \times 10^{-2}$ atm, respectively. GaN was grown under normal pressure at a temperature of 1060° C. A mixture of $N_2$ gas with 2% $H_2$ gas was used as the carrier gas. The use of such a gas mixture of $N_2$ and $H_2$ as the carrier gas can lead to both high crystalline quality and easy separation of substrate, furthermore, to reduction in the warp of the substrate.

Instead of $N_2$, inert gases such as Ar and He may be used. Compared with the surface of the GaN layer grown entirely using the $N_2$ carrier gas, the reduction of irregular grain-growth and the improvement of surface morphology were found in the surface of the GaN layer 4 obtained here. The GaN layer 4 was automatically separated from the sapphire substrate 1 at the void layer during the step for cooling after the completion of growth, and a freestanding GaN substrate was obtained (FIG. 12(e)). The surface of the obtained freestanding GaN substrate 4 was very flat, and microscopic and SEM observations confirmed that its surface morphology was the same as or better than that of a conventional GaN layer grown on a sapphire substrate through a buffer layer grown at a low temperature.

Figure 15:
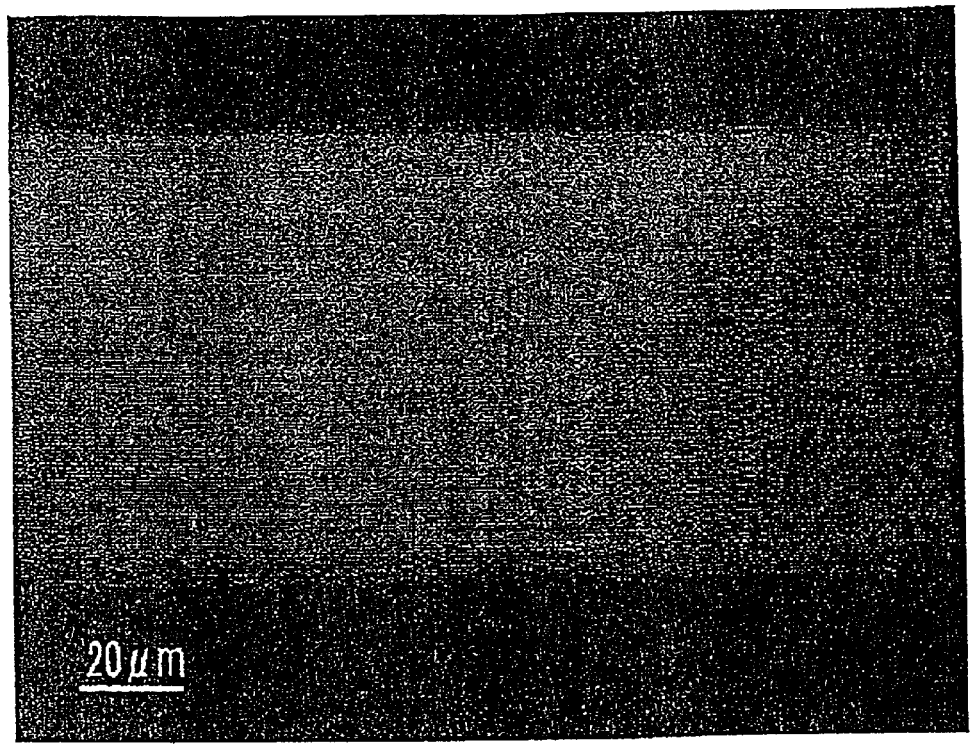
FIG. 15 is a photographical printing-out showing a fluorescence-microscopic observation view of section of a freestanding GaN substrate obtainable by the crystal growth using 2% hydrogen gas containing nitrogen gas mixture as a carrier gas, according to the present invention.

FIG. 15 shows a photographical section view of the freestanding GaN substrate observed by fluorescent microscope. As illustrated in the figure, on the side of the face where the sapphire substrate 1 was separated off, dark stripe lines were observed which are considered to be originated from defects induced close to the interface between the Titan film 3 and GaN layer 4 and to be propagated in the direction to crystal growth. However, on the side of the surface (the top one) opposite to the face separated, such lines disappeared, indicating that the GaN layer 4 had a good crystalline structure.

Example 14

In this example, a freestanding GaN substrate was prepared in the similar manner to that of Example 13, with exception that a mixture of $N_2$ gas with 10% $H_2$ gas was used as the carrier gas for the growth step of GaN layer 4. The use of such a gas mixture of $N_2$ and $H_2$ as the carrier gas can lead to both high crystalline quality and easy separation of substrate, furthermore, to reduction in the warp of the substrate. Instead of $N_2$, inert gases such as Ar and He may be used. Compared with the surface of the GaN layer grown entirely using the $N_2$ carrier gas, the reduction of irregular grain-growth and the improvement of surface morphology were found in the surface of the GaN layer 4 obtained here. The surface of the obtained freestanding GaN substrate 4 was very flat, and microscopic and SEM observations confirmed that its surface morphology was the same as or better than that of a conventional GaN layer grown on a sapphire substrate through a buffer layer grown at a low temperature. The FWHM of diffraction of the GaN (0002) face and (10-10) face in the X-ray diffraction measurement was about 70 arcseconds and 90 arcseconds, respectively, at any position in the substrate, and verified that this substrate showed good and uniform crystalline quality. The radius of curvature of the warp of the obtained freestanding GaN substrate 4 was about 8 m, and the measurement indicated that a very flat substrate was obtained. The obtained freestanding GaN substrate 4 was objected to etching with in a hot mixture (250° C.) of phosphoric acid and sulfuric acid, and etch pits formed on its surface were counted up. It was verified that its density was as small as $4 \times 10^6/cm^2$, indicating that a substrate of GaN single crystal with low dislocation density was obtained.

Figure 16:
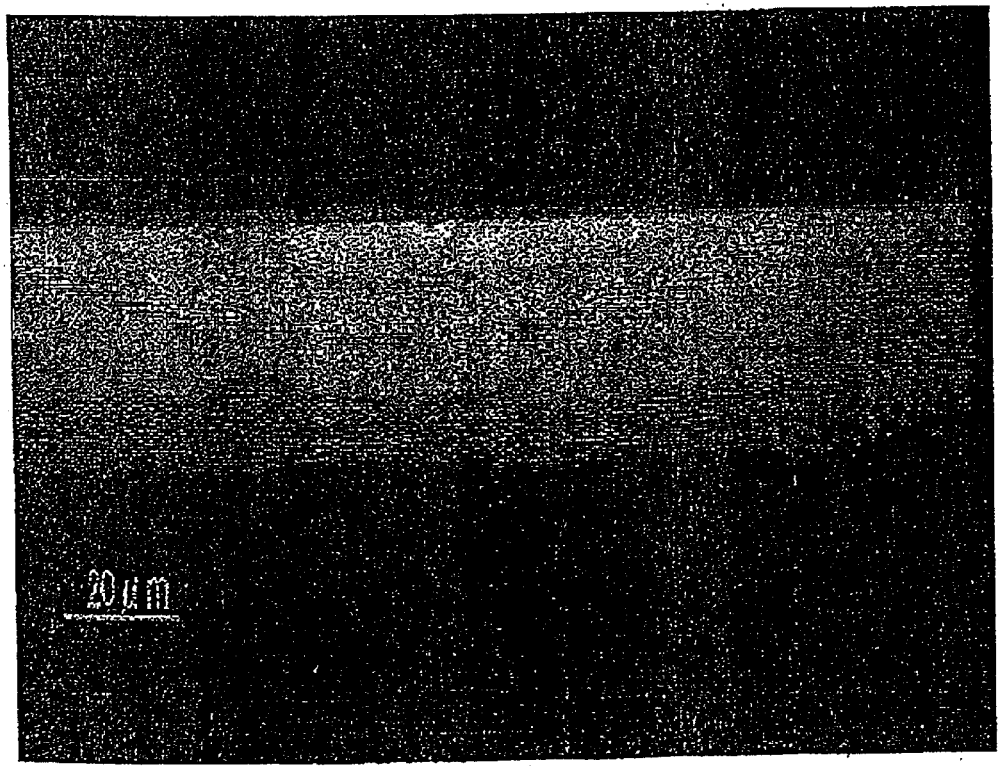
FIG. 16 is a photographical printing-out showing a fluorescence-microscopic observation view of section of a freestanding GaN substrate obtainable by the crystal growth using 10% hydrogen gas containing nitrogen gas mixture as a carrier gas, according to the present invention.

FIG. 16 shows a photographical section view of the freestanding GaN substrate observed by fluorescent microscope. As illustrated in the figure, such dark stripe lines as shown in FIG. 15 disappeared, but only dark shades were observed close to the face where the sapphire substrate 1 was separated off. It can be understood that the propagation of the defects toward the top surface were well prevented by the increased hydrogen content mixed in the carried gas in comparison with that of Example 13, and thus its crystal growth upward was formed in high quality.

In the above-described examples, only the cases where the present invention is applied to a method for manufacturing a GaN substrate are explained, and in addition, the present invention can be applied to the manufacture of a freestanding single crystal substrate of a ternary mixed crystal, such as aluminum gallium nitride and gallium indium nitride as well as the manufacture of a p-type GaN substrate doped with Mg or the like. Also, while only a titanium film is used as the metal film in the above-described examples, an alloy film can also be used. Furthermore, a procedure in which an element having a surfactant effect, such as silicon, is adsorbed on the surface of the metal film, and a GaN layer is grown thereon can also be selected to further reduce defect density.

In addition, concerning selective growth using a mask, although the use of a stripe mask pattern is used in the above-described examples, the use of various mask patterns, such as dotted openings and checker-wise patterned openings can also be taken into consideration.

Furthermore, while the cases where the gas mixture of $H_2$ and an inert gas is used as a carrier gas for growing the GaN layer 4 were well explained above, the GaN layer 4 may be grown in stepwise manner where only an inert gas or a mixture of an inert gas containing $H_2$ in low concentrations is used initially as a carrier gas to grow GaN of a thin thickness enough to cover the surface of the underlying GaN layer 2, and then the content of $H_2$ contained in the carrier gas is increased gradually for the following stage to grow GaN layer 4 up to a thick layer thickness.

The semiconductor substrate of a group III nitride obtained according to the present invention can be used widely as a substrate for a GaN-based device. Particularly, since a high-quality GaN-based crystal with low defect density can be obtained by the use as a substrate for a laser diode, a laser diode with high-reliability, high-performance can be manufactured.

SUMMARY OF DISCLOSURE

According to the present invention, as described above, since a second semiconductor layer of a group III nitride is formed on a first semiconductor layer of a group III nitride having voids, the following effects are obtained:

Firstly, a semiconductor substrate of a group III nitride having a low defect density and a high crystal quality can be obtained. This is because the layer having voids acts as a strain-relieving layer, which will relieve strain caused by difference in lattice constants or coefficients of thermal expansion between the basal substrate and the semiconductor layer of the group III nitride.

Secondly, the warp of the obtained semiconductor substrate can be reduced remarkably, and thereby the yield in the photolithography step for the device process can be improved. This is because the layer having voids acts as a strain-relieving layer, which will relieve strain caused by difference in lattice constants or coefficients of thermal expansion between the substrate and the semiconductor layer of the group III nitride.

Thirdly, since the basal substrate can be removed easily, a freestanding substrate of a well-shaped GaN single crystal without cracks and faults can be obtained easily. This is because a layer having voids are intervened between the basal substrate and the second semiconductor layer of a group III nitride, and thereby the basal substrate can be removed easily by means of a chemical agent, a mechanical impact or the like.

What we claim is:

1. A process for manufacturing a semiconductor substrate made of a group III nitride comprising the steps of:
    forming a metal film on a basal substrate having a first semiconductor layer of a group III nitride formed on a base material or a basal substrate comprising a first semiconductor layer of a group III nitride,
    heat-treating said basal substrate in an atmosphere containing hydrogen gas or hydrogen-containing compound gas to form voids in said first semiconductor layer of the group III nitride, and
    forming a second semiconductor layer of a group III nitride on said metal film.

2. A process for manufacturing a semiconductor substrate made of a group III nitride claimed in claim 1, characterized in that fine holes are formed in the metal film or the metal nitride film as a result of the heat treatment.

3. A process for manufacturing a semiconductor substrate made of a group III nitride claimed in claim 2, characterized in that said metal film contains scandium, yttrium, titanium, zirconium, hafnium, vanadium, niobium, tantalum, chromium, molybdenum, tungsten, rhenium, iron, ruthenium, osmium, cobalt, rhodium, iridium, nickel, palladium, manganese, copper, platinum or gold.

4. A process for manufacturing a semiconductor substrate made of a group III nitride claimed in claim 2, characterized in that said metal film contains titanium, nickel, tantalum or tungsten.

5. A process for manufacturing a semiconductor substrate made of a group III nitride claimed in claim 2, characterized by further comprising a step of etching off said metal film or the nitride film of said metal to peel off said basal substrate, after forming the second semiconductor layer of the group III nitride.

6. A process for manufacturing a semiconductor substrate made of a group III nitride claimed in claim 1, characterized by further comprising a step of removing said basal substrate, after forming the second semiconductor layer of the group III nitride.

7. A process for manufacturing a semiconductor substrate made of a group III nitride claimed in claim 2, characterized by further comprising a step of removing said basal substrate, after forming the second semiconductor layer of the group III nitride.

8. A process for manufacturing a semiconductor substrate made of a group III nitride claimed in claim 1, characterized by further comprising a step of applying stress to said first semiconductor layer of the group III nitride having voids to peel off said basal substrate mechanically, after forming the second semiconductor layer of the group III nitride.

9. A process for manufacturing a semiconductor substrate made of a group III nitride claimed in claim 2, characterized by further comprising a step of applying stress to said first semiconductor layer of the group III nitride having voids to peel off said basal substrate mechanically, after forming the second semiconductor layer of the group III nitride.

10. A process for manufacturing a semiconductor substrate made of a group III nitride claimed in claim 2, characterized in that said step of forming the second semiconductor layer of the group III nitride is a step of forming a mask having an opening on the surface of a substrate, and then epitaxially growing the semiconductor layer of the group III nitride on said opening and said mask.

11. A process for manufacturing a semiconductor substrate made of a group III nitride claimed in claim 2, characterized in that the thickness of said second semiconductor layer of the group III nitride is at least 1 $\mu$m and optionally reaches up to 300 $\mu$m.

12. A process for manufacturing a semiconductor substrate made of a group III nitride claimed in claim 2, characterized in that said first and second semiconductor layers of the group III nitride are independently made of GaN, AlGaN, InGaN or InAlGaN.

13. A process for manufacturing a semiconductor substrate made of a group III nitride claimed in claim 2, characterized in that the thickness of said first semiconductor layer of the group III nitride is no less than 10 nm but no more than 5 μm.

14. A process for manufacturing a semiconductor substrate made of a group III nitride claimed in claim 13, characterized in that the face for crystal growth is selected from (0001) face or (1-100) face of said sapphire substrate.

15. A process for manufacturing a semiconductor substrate made of a group III nitride claimed in claim 2, characterized in that said base material is a sapphire substrate.

16. A process for manufacturing a semiconductor substrate made of a group III nitride claimed in claim 2, characterized in that said heat treatment for forming voids in said first semiconductor layer of the group III nitride is carried out at a temperature of no lower than 700° C. but no higher than 1400° C.

17. A process for manufacturing a semiconductor substrate made of a group III nitride claimed in claim 2, characterized in that said step of forming the second semiconductor layer of the group III nitride is carried out sequentially after the heat treatment for forming voids in said first semiconductor layer of the group III nitride, without removing the basal substrate out of the apparatus for performing said heat treatment.

18. A process for manufacturing a semiconductor substrate made of a group III nitride claimed in claim 2, characterized in that said step of forming the second semiconductor layer of the group III nitride is carried out using a gas mixture of hydrogen gas and an inert gas as carrier gas for crystal growth.

19. A process for manufacturing a semiconductor substrate made of a group III nitride claimed in claim 18, characterized in that the content of hydrogen gas in the gas mixture is no less than 5% but no more than 70% by volume.

20. A process for manufacturing a semiconductor substrate made of a group III nitride claimed in claim 1, characterized in that said metal film contains scandium, yttrium, titanium, zirconium, hafnium, vanadium, niobium, tantalum, chromium, molybdenum, tungsten, rhenium, iron, ruthenium, osmium, cobalt, rhodium, iridium, nickel, palladium, manganese, copper, platinum or gold.

21. A process for manufacturing a semiconductor substrate made of a group III nitride claimed in claim 1, characterized in that said metal film contains titanium, nickel, tantalum or tungsten.

22. A process for manufacturing a semiconductor substrate made of a group III nitride claimed in claim 1, characterized by further comprising a step of etching off said metal film or the nitride film of said metal to peel off said basal substrate, after forming the second semiconductor layer of the group III nitride.

23. A process for manufacturing a semiconductor substrate made of a group III nitride claimed in claim 1, characterized in that said step of forming the second semiconductor layer of the group III nitride is a step of forming a mask having an opening on the surface of a substrate, and then epitaxially growing the semiconductor layer of the group III nitride on said opening and said mask.

24. A process for manufacturing a semiconductor substrate made of a group III nitride claimed in claim 1, characterized in that the thickness of said second semiconductor layer of the group III nitride is at least 1 μm and optionally reaches up to 300 μm.

25. A process for manufacturing a semiconductor substrate made of a group III nitride claimed in claim 1, characterized in that said first and second semiconductor layers of the group III nitride are independently made of GaN, AlGaN, InGaN or InAlGaN.

26. A process for manufacturing a semiconductor substrate made of a group III nitride claimed in claim 1, characterized in that the thickness of said first semiconductor layer of the group III nitride is no less than 10 nm but no more than 5 μm.

27. A process for manufacturing a semiconductor substrate made of a group III nitride claimed in claim 1, characterized in that said base material is a sapphire substrate.

28. A process for manufacturing a semiconductor substrate made of a group III nitride claimed in claim 27, characterized in that the face for crystal growth is selected from (0001) face or (1-100) face of said sapphire substrate.

29. A process for manufacturing a semiconductor substrate made of a group III nitride claimed in claim 1, characterized in that said heat treatment for forming voids in said first semiconductor layer of the group III nitride is carried out at a temperature of no lower than 700° C. but no higher than 1400°C.

30. A process for manufacturing a semiconductor substrate made of a group III nitride claimed in claim 1, wherein said step of forming the second semiconductor layer of the group III nitride is carried out sequentially after the heat treatment for forming voids in said first semiconductor layer of the group III nitride, without removing the basal substrate out of the apparatus for performing said heat treatment.

31. A process for manufacturing a semiconductor substrate made of a group III nitride claimed in claim 1, wherein said step of forming the second semiconductor layer of the group III nitride is carried out using a gas mixture of hydrogen gas and an inert gas as carrier gas for crystal growth.

32. A process for manufacturing a semiconductor substrate made of a group III nitride claimed in claim 31, characterized in that the content of hydrogen gas in the gas mixture is no less than 5% but no more than 70% by volume.

33. A process for manufacturing a semiconductor substrate made of a group III nitride comprising the steps of:
  forming a metal film on a basal substrate having a first semiconductor layer of a group III nitride formed on a base material or a basal substrate comprising a first semiconductor layer of a group III nitride,
  heat-treating said basal substrate in an atmosphere containing nitrogen gas, oxygen gas or a mixture of nitrogen gas and oxygen gas to form voids in said first semiconductor layer of the group III nitride, and
  forming a second semiconductor layer of a group III nitride on said metal film.

34. A process for manufacturing a semiconductor substrate made of a group III nitride comprising the steps of:
  forming a metal film on a basal substrate having a first semiconductor layer of a group III nitride formed on a base material or a basal substrate comprising a first semiconductor layer of a group III nitride,
  heat-treating said basal substrate in an atmosphere containing nitrogen gas or nitrogen-containing compound gas to convert the surface of said metal film into the nitride thereof,
  heat-treating said basal substrate in an atmosphere containing hydrogen gas or hydrogen-containing compound gas to form voids in said first semiconductor layer of the group III nitride, and
  forming a second semiconductor layer of a group III nitride on said metal film.

35. A process for manufacturing a semiconductor substrate made of a group III nitride comprising the steps of:

forming a metal film on a basal substrate having a first semiconductor layer of a group III nitride formed on a base material or a basal substrate comprising a first semiconductor layer of a group III nitride, heat-treating said basal substrate in an atmosphere containing nitrogen gas or nitrogen-containing compound gas and also hydrogen gas or hydrogen-containing compound gas to form voids in said first semiconductor layer of a group III nitride and also to convert the surface of said metal film into the nitride thereof simultaneously, and forming a second semiconductor layer of a group III nitride on said metal film.

36. A process for manufacturing a semiconductor substrate made of a group III nitride comprising the steps of:

heat-treating a basal substrate having a first semiconductor layer of a group III nitride formed on a base material or a basal substrate comprising a first semiconductor layer of a group III nitride to form voids in said first semiconductor layer of the group III nitride, and forming a second semiconductor layer of a group III nitride on said first semiconductor layer of the group III nitride, wherein said step of heat-treatment is carried out under the controlled condition of temperature and atmosphere where the crystal structure of the group III nitride used for the first semiconductor is decomposed, and at least nitrogen derived from the group III nitride vaporize, resulting in the percentage of the voids formed in the first semiconductor layer being no less than 20% but no more than 90% by volume.

37. A process for manufacturing a semiconductor substrate made of a Group III nitride comprising the steps of:

forming a metal film on a basal substrate having a first semiconductor layer of a Group III nitride formed on a base material or a basal substrate comprising a first semiconductor layer of a Group III nitride;

heat-treating said basal substrate covered with the metal film to form voids in said first semiconductor layer of the Group III nitride; and forming a second semiconductor layer of a Group III nitride on said first semiconductor layer of the Group III nitride containing the voids formed in advance.

* * * * *